(12) United States Patent  (10) Patent No.: US 9,115,868 B2
Deeman et al.  (45) Date of Patent: Aug. 25, 2015

(54) WAVELENGTH CONVERSION COMPONENT WITH IMPROVED PROTECTIVE CHARACTERISTICS FOR REMOTE WAVELENGTH CONVERSION

(75) Inventors: Neil Deeman, San Ramon, CA (US); Bing Dai, Fremont, CA (US); Charles Edwards, Pleasanton, CA (US)

(73) Assignee: Intematix Corporation, Fremont, CA (US)

( * ) Notice: Subject to any disclaimer, the term of this patent is extended or adjusted under 35 U.S.C. 154(b) by 28 days.

(21) Appl. No.: 13/273,196

(22) Filed: Oct. 13, 2011

(65) Prior Publication Data

US 2013/0094176 A1  Apr. 18, 2013

(51) Int. Cl.
*F21V 9/16* (2006.01)
*F21K 99/00* (2010.01)
*H01L 33/50* (2010.01)

(52) U.S. Cl.
CPC ... *F21V 9/16* (2013.01); *F21K 9/56* (2013.01); *H01L 33/507* (2013.01)

(58) Field of Classification Search
CPC ......... F21Y 2101/02; F21V 9/16; F21K 9/00; F21K 9/56; G09F 13/22; F21S 10/02
USPC .............. 362/84, 213, 249.02, 231, 260, 293
See application file for complete search history.

(56) References Cited

U.S. PATENT DOCUMENTS

| | | | |
|---|---|---|---|
| 3,290,255 A | 12/1966 | Smith | |
| 3,593,055 A | 7/1971 | Geusic et al. | |
| 3,670,193 A | 6/1972 | Thorington et al. | |
| 3,676,668 A | 7/1972 | Collins et al. | |
| 3,691,482 A | 9/1972 | Pinnow et al. | |
| 3,709,685 A | 1/1973 | Hercock et al. | |
| 3,743,833 A | 7/1973 | Martie et al. | |
| 3,763,405 A | 10/1973 | Mitsuhata | |
| 3,793,046 A | 2/1974 | Wanmaker et al. | |
| 3,819,973 A | 6/1974 | Hosford | |
| 3,819,974 A | 6/1974 | Stevenson et al. | |

(Continued)

FOREIGN PATENT DOCUMENTS

| | | |
|---|---|---|
| CN | 101232061 | 1/2007 |
| EP | 0395775 | 11/1990 |

(Continued)

OTHER PUBLICATIONS

"Fraunhofer-Gesellschafl: Research News Special1997", http://www.fhg.de/press/md-e/md1997/sondert2.hlm,(accessed on Jul. 23, 1998), Jan. 1997, Publisher: Fraunhofer Institute.

(Continued)

*Primary Examiner* — Peggy Neils
(74) *Attorney, Agent, or Firm* — Vista IP Law Group, LLP

(57) ABSTRACT

A wavelength conversion component for remote wavelength conversion is described in which a wavelength conversion layer is sandwiched between two light transmissive hermetic substrates. The light transmissive hermetic substrates form a barrier that protects the wavelength conversion layer from exposure to external environmental conditions. In some approaches, the wavelength conversion component further includes a sealant material disposed around an outer edge of the sandwich structure, where the sealant material hermetically seals an outer edge wavelength conversion layer.

13 Claims, 24 Drawing Sheets

(56) References Cited

U.S. PATENT DOCUMENTS

| | | |
|---|---|---|
| 3,849,707 A | 11/1974 | Braslau et al. |
| 3,875,456 A | 4/1975 | Kana et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoeberl |
| 4,176,294 A | 11/1979 | Thornton, Jr. |
| 4,176,299 A | 11/1979 | Thornton, Jr. |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,959,316 A | 9/1999 | Lowery |
| 5,962,971 A | 10/1999 | Chen |
| 5,998,925 A | 12/1999 | Shimizu |
| 6,137,217 A | 10/2000 | Pappalardo et al. |
| 6,340,824 B1 | 1/2002 | Komoto et al. |
| 6,504,301 B1 | 1/2003 | Lowery |
| 6,576,488 B2 | 6/2003 | Collins et al. |
| 6,600,175 B1 | 7/2003 | Baretz et al. |
| 6,642,618 B2 | 11/2003 | Yagi et al. |
| 6,642,652 B2 | 11/2003 | Collins et al. |
| 6,759,809 B2 * | 7/2004 | Grant ........................ 315/169.3 |
| 6,869,812 B1 | 3/2005 | Liu |
| 7,036,946 B1 * | 5/2006 | Mosier ........................ 362/27 |
| 7,153,015 B2 | 12/2006 | Brukilacchio |
| 7,311,858 B2 | 12/2007 | Wang |
| 7,390,437 B2 | 6/2008 | Dong |
| 7,479,662 B2 | 1/2009 | Soules et al. |
| 7,575,697 B2 | 8/2009 | Li |
| 7,601,276 B2 | 10/2009 | Li |
| 7,615,795 B2 | 11/2009 | Baretz et al. |
| 7,655,156 B2 | 2/2010 | Cheng |
| 7,943,945 B2 | 5/2011 | Baretz et al. |
| 7,984,999 B2 * | 7/2011 | Harbers et al. ................. 362/231 |
| 8,075,148 B2 * | 12/2011 | Nada ................................ 362/84 |
| 8,083,364 B2 * | 12/2011 | Allen ................................ 362/84 |
| 8,159,131 B2 * | 4/2012 | Helbing ............................ 313/512 |
| 8,162,506 B2 * | 4/2012 | Wei et al. ........................ 362/231 |
| 8,247,248 B2 * | 8/2012 | Ling ................................ 438/27 |
| 8,567,974 B2 * | 10/2013 | Hoelen et al. .................... 362/84 |
| 2004/0016938 A1 | 1/2004 | Baretz et al. |
| 2004/0227149 A1 | 11/2004 | Ibbetson |
| 2005/0152146 A1 | 7/2005 | Owen |
| 2006/0049416 A1 | 3/2006 | Baretz et al. |
| 2006/0060867 A1 | 3/2006 | Suehiro |
| 2006/0145123 A1 | 7/2006 | Li |
| 2006/0158090 A1 | 7/2006 | Wang |
| 2006/0261309 A1 | 11/2006 | Li |
| 2007/0029526 A1 | 2/2007 | Cheng |
| 2007/0114562 A1 | 5/2007 | Radkov et al. |
| 2007/0195532 A1 | 8/2007 | Reisenauer et al. |
| 2007/0273274 A1 * | 11/2007 | Horiuchi et al. ............... 313/504 |
| 2007/0279903 A1 | 12/2007 | Negley et al. |
| 2008/0111472 A1 | 5/2008 | Liu |
| 2008/0224597 A1 | 9/2008 | Baretz et al. |
| 2008/0224598 A1 | 9/2008 | Baretz et al. |
| 2009/0147497 A1 * | 6/2009 | Nada ................................ 362/84 |
| 2009/0283721 A1 | 11/2009 | Liu |
| 2009/0294780 A1 | 12/2009 | Chou |
| 2010/0096965 A1 * | 4/2010 | Oyaizu et al. ..................... 313/1 |
| 2010/0165599 A1 * | 7/2010 | Allen ................................ 362/84 |
| 2010/0232134 A1 * | 9/2010 | Tran ................................ 362/84 |
| 2010/0259919 A1 | 10/2010 | Khazi et al. |
| 2011/0068356 A1 * | 3/2011 | Chiang et al. .................. 257/98 |
| 2011/0149578 A1 | 6/2011 | Niiyama et al. |
| 2011/0170277 A1 * | 7/2011 | Li ................................ 362/84 |
| 2011/0227102 A1 | 9/2011 | Huseel et al. |
| 2012/0147588 A1 * | 6/2012 | Yang ................................ 362/84 |

FOREIGN PATENT DOCUMENTS

| | | |
|---|---|---|
| EP | 0534140 | 3/1993 |
| EP | 647694 | 4/1995 |
| GB | 2 017 409 | 10/1979 |
| JP | 48-20539 | 3/1973 |
| JP | 50-79379 | 11/1973 |
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-269718 | 9/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 06-267301 | 9/1994 |
| JP | 6283755 | 10/1994 |
| JP | 07-099345 | 4/1995 |
| JP | 07-176794 | 7/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | 2003-234513 | 8/2003 |
| JP | P2003-234513 | 8/2003 |
| JP | 2004071771 A | 3/2004 |

(56) References Cited

FOREIGN PATENT DOCUMENTS

| | | |
|---|---|---|
| JP | 3724490 | 9/2005 |
| JP | P3724490 | 9/2005 |
| JP | P3724498 | 9/2005 |
| JP | 2006093372 A | 4/2006 |
| JP | 2007049019 A | 2/2007 |
| JP | 2009-071005 A | 4/2009 |
| KR | 10-0649704 B1 | 11/2006 |
| WO | WO 9108508 | 6/1991 |
| WO | WO 94/00973 | 1/1994 |
| WO | WO 2004/021461 | 3/2004 |
| WO | WO 2005106926 A2 | 11/2005 |
| WO | WO 2008019041 A2 | 2/2008 |
| WO | WO 2010/074963 | 1/2010 |

OTHER PUBLICATIONS

Adachi, C. et al., "Blue light-emitting organic electroluminescent devices", "Appl. Phys. Lett.", Feb. 26, 1990, pp. 799-801, vol. 56, No. 9.

Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

Apr. 14, 2010 Office Action in U.S. Appl. No. 11/264,124.

Apr. 15, 2009 Office Action in U.S. Appl. No. 11/264,124, issued by Abu I Kalam.

Armaroli, N. et al., "Supramolecular Photochemistry and Photophysics.", "J. Am. Chem. Soc.", 1994, pp. 5211-5217, vol. 116.

Aug. 21, 2006 Office Action in U.S. Appl. No. 10/623,198, issued by Thao X. Le.

Aug. 24, 2007 Office Action in U.S. Appl. No. 11/264,124, issued by Thao X. Le.

Aug. 26, 2010 Office Action in U.S. Appl. No. 12/131,118.

Berggren, M. et al., "Light-emitting diodes with variable colours from polymer blends", "Nature", Dec. 1, 1994, pp. 444-446, vol. 372.

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.

Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.

Bradfield, P.L., et al., "Electroluminescence from sulfur impurities in a p-n junction formed in epitaxial silicon", "Appl. Phys. Lett", 07110/1989, pp. 10D-102, vol. 55, No. 2.

Chao, Zhang Jin, et al., "White light emitting glasses", "Journal of Solid State Chemistry", 1991, pp. 17-29, vol. 93.

Comrie, M., "Full Color LED Added to Lumex's Lineup", "EBN", Jun. 19, 1995, p. 28.

CRC Handbook, 63rd Ed., (1983) p. E-201.

Das, N.C., et al., "Luminescence spectra of ann-channel metal-oxide-semiconductor field-effect transistor at breakdown", 1990, pp. 1152-1153, vol. 56, No. 12.

Dec. 16, 2004 Office Action in U.S. Appl. No. 10/623,198, issued by Thao X. Le.

Dictionary Definition of Phosphor, Oxford English Dictionary Online, Mar. 9, 2012 (Only partial available due to corrupt file on Mar. 22, 2012 in U.S. Appl. No. 12/131,119; Request for Full Reference filed).

El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. No. 12/131,118, issued by Abul Kalam.

Feb. 26, 2008 Office Action in U.S. Appl. No. 11/264,124, issued by Abu I Kalam.

Feb. 4, 2005 Office Action in U.S. Appl. No. 10/623,198, issued by Thao X. Le.

Feb. 7, 2007 Office Action in U.S. Appl. No. 11/264,124, issued by Thao X. Le.

Forrest, S. et al., "Organic emitters promise a new generation of displays", "Laser Focus World ", Feb. 1995, pp. 99-107.

Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Hamakawa, Yoshihiro, et al., "Toward a visible light display by amorphous SiC:H alloy system", "Optoelectronics—Devices and Technologies", Dec. 1989, pp. 281-294, vol. 4, No. 2.

Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.

Jang, S., "Effect of Avalanche-Induced Light Emission on the Multiplication Factor in Bipolar Junction Transistors", "Solid-State Electronics", 1991, pp. 1191-1196, vol. 34, No. 11.

Jan. 29, 2007 Office Action in U.S. Appl. No. 10/623,198, issued by Thao X. Le.

Jan. 30, 2006 Office Action in U.S. Appl. No. 11/264,124, issued by Thao X. Le.

Jan. 7, 2011 Office Action in U.S. Appl. No. 12/131,119, issued by Steven Y. Horikoshi.

Jul. 10, 2008 Office Action in U.S. Appl. No. 11/264,124, issued by Abu I Kalam.

Jul. 14, 2005 Notice of Allowance, Notice of Allowability, and Examiner's Statement of Reasons for Allowance in U.S. Appl. No. 10/623,198, issued by Thao X. Le.

Jul. 14, 2011 Office Action in U.S. Appl. No. 12/131,119, issued by Steve Horikoshi.

Jul. 7, 2011 Office Action in U.S. Appl. No. 12/131,118, issued by Abu I Kalam.

Jun. 14, 2006 Office Action in U.S. Appl. No. 11/264,124, issued by Thao X. Le.

Jun. 26, 2007 Office Action in U.S. Appl. No. 10/623,198, issued by Theo X. Le.

Kido, J. et al., "1,2,4-Triazole Derivative as an Electron Transport Layer in Organic Luminescent Devices", "Jpn. J. Appl. Phys.", Jul. 1, 1993, pp. L917-L920, vol. 32.

Kido, J. et al., "Bright blue electroluminescence from poly(N-vinylcarbazole)", "Appl. Phys. Letters", Nov. 8, 1993, pp. 2627-2629, vol. 63, No. 19.

Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.

Krames, M., et al., "Status and Future of High-Power Light-Emitting Diodes for Solid-Slate Lighting", "Journal of Display Technology", Jun. 2007, pp. 160-175, vol. 3, No. 2.

Kudryashov, V., et al., "Spectra of Superbright Blue and Green InGaN/AlGaN/GaN Light-Emitting diodes", "Journal of the European Ceramic Society", May 1996, pp. 2033-2037, vol. 17.

Larach, S., et al., "Blue emitting luminescent phosphors: Review and status", "Int'l Workshop on Electroluminescence", 1990, pp. 137-143.

LEDs and Laser Diodes, Electus Distribution, copyright 2001, available at URL:http://www.jaycar.com.au/images_uploaded/ledlaser.Pdf.

Lester, S., et al., "High dislocation densities in high efficiency GaN-based light-emitting diodes", "Appl. Phys. Lett.", Mar. 6, 1995, pp. 1249-1251, vol. 66, No. 10.

Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn:documentum:eCommerce_soi_EU :09007bb280021e27.pdf:09007bb280021e27.pdf.

Mar. 2, 2009 Office Action in U.S. Appl. No. 10/623,198, issued by Abu I Kalam.

Mar. 22, 2012 Office Action in U.S. Appl. No. 12/131,119, issued by Steven Y. Horikoshi.

(56) References Cited

OTHER PUBLICATIONS

Mar. 28, 2006 Office Action in U.S. Appl. No. 10/623,198, issued by Thao X. Le.

Mar. 4, 2011 Notice of Allowance, Notice of Allowability, Examiner's Interview Summary, Examiner's Amendment/Comment and Examiner's Statement of Reason for Allowance in U.S. Appl. No. 11/264,124, issued by Abu I Kalam.

Mar. 7, 2008 Office Action in U.S. Appl. No. 10/623,198, issued by Abu I Kalam.

Maruska, H.P., "Gallium nitride light-emitting diodes (dissertation)", "Dissertation Submitted to Stanford University", Nov. 1973.

Maruska, H.P., et al., "Violet luminescence of Mg-doped GaN", "Appl. Phys. Lett.", Mar. 15, 1973, pp. 303-305, vol. 22, No. 6.

May 4, 2010 Office Action in U.S. Appl. No. 12/131,119.

McGraw-Hill, "McGraw-Hill Dictionary of Scientific and Technical Terms, Third Edition", "McGraw-Hill Dictionary of Scientific and Technical Terms", 1984, p. 912 and 1446, Publisher: McGraw-Hill.

McGraw-Hill, "McGraw-Hill Encyclopedia of Science and Technology, Sixth Edition", "McGraw-Hill Encyclopedia of Science and Technology", 1987, p. 582 and 60-63, vol. 9-10, Publisher: McGraw-Hill.

Mimura, Hidenori, et al., "Visible electroluminescence from uc-SiC/porous Si/c-Si p-n junctions", "Int. J. Optoelectron.", 1994, pp. 211-215, vol. 9, No. 2.

Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.

Morkoc et al., "Large-band-gap SIC, 111-V nitride, and II-VI ZnSe-based semiconductor device technologies", J. Appl. Phys. 76(3), 1; Mar. 17, 1994; Illinois University.

Muench, W.V., et al., "Silicon carbide light-emitting diodes with epitaxial junctions", "Solid-State Electronics", Oct. 1976, pp. 871-874, vol. 19, No. 10.

Mukai, T., et al., "Recent progress of nitride-based light emitting devices", "Phys. Stat. Sol.", Sep. 2003, pp. 52-57, vol. 200, No. 1.

Nakamura, S., et al., "High-power InGaN single-quantum-well-structure blue and violet light-emitting diodes", "Appl. Phys. Lett.", Sep. 25, 1995, pp. 1868-1870, vol. 67, No. 13.

Nakamura, S., et al., "The Blue Laser Diode: GaN Based Light Emitters and Lasers", Mar. 21, 1997, p. 239, Publisher: Springer-Verlag.

Nakamura, S., et al., "The Blue Laser Diode: The Complete Story, 2nd Revised and Enlarged Edition", Oct. 2000, pp. 237-240, Publisher: Springer-Verlag.

Nov. 30, 2010 Office Action in U.S. Appl. No. 12/131,118.

Oct. 20, 2008 Office Action in U.S. Appl. No. 10/623,198, issued by Abu I Kalam.

Pankove, J.I., et al., "Scanning electron microscopy studies of GaN", "Journal of Applied Physics", Apr. 1975, pp. 1647-1652, vol. 46, No. 4.

Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.

Pei, Q, et al., "Polymer Light-Emitting Electrochemical Cells", "Science", Aug. 25, 1995, pp. 1086-1088, vol. 269, No. 5227.

Reexam Advisory Action dated Sep. 28, 2012 for U.S. Appl. No. 90/010,940.

Reexam Final Office Action dated May 24, 2012 for U.S. Appl. No. 90/010,940.

Reexam Final Office Action dated Nov. 7, 2011 for U.S. Appl. No. 90/010,940.

Reexam Non-Final Office Action dated Jan. 26, 2012 for U.S. Appl. No. 90/010,940.

Reexam Non-Final Office Action dated Mar. 3, 2011 for U.S. Appl. No. 90/010,940.

Reexam Non-Final Office Action dated Sep. 20, 2010 for U.S. Appl. No. 90/010,940.

Roman. D., "LEDs Turn a Brighter Blue", "Electronic Buyers' News", Jun. 19, 1995, pp. 28 and 35, vol. 960, Publisher: CMP Media LLC.

Saleh and Teich, Fundamentals of Photonics, New York: John Wiley & Sons, 1991, pp. 592-594.

Sato, Yuichi, et al., "Full-color fluorescent display devices using a near-UV light-emitting diode", "Japanese Journal of Applied Physics", Jul. 1996, pp. L838-L839, vol. 35, No. ?A.

Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.

Sep. 29, 2009 Office Action in U.S. Appl. No. 11/264,124, issued by Abu I Kalam.

Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.

Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.

The Penguin Dictionary of Electronics, 3rd edition, pp. 315,437-438, 509-510, copyright 1979, 1988, and 1998.

Ura, M., "Recent trends of development of silicon monocarbide blue-light emission diodes", "Kinzoku", 1989, pp. 11-15, vol. 59, No. 9.

Werner, K., "Higher Visibility for LEDs", "IEEE Spectrum", Jul. 1994, pp. 30-39.

Wojciechowski, J. et al., "Infrared-To-Blue Up-Converting Phosphor", "Electron Technology", 1978, pp. 31-47, vol. 11, No. 3.

Yamaguchi, Y. et al., "High-Brightness SiC Blue LEDs and Their Application to Full Color LED Lamps", "Optoelectronics—Devices and Technologies", Jun. 1992, pp. 57-67, vol. 7, No. 1.

Yang, Y., et al., "Voltage controlled two color light-emitting electrochemical cells", "Appl. Phys. Lett.", 1996, vol. 68, No. 19.

Yoshimi, Masashi, et al., "Amorphous carbon basis blue light electroluminescent device", "Optoelectronics—Devices and Technologies", Jun. 1992, pp. 69-81, vol. 7, No. 1.

Zanoni, E., et al., "Impact ionization, recombination, and visible light emission in ALGaAs/GaAs high electron mobility transistors", "J. Appl. Phys.", 1991, pp. 529-531, vol. 70, No. 1.

Zanoni, E., et al., "Measurements of Avalanche Effects and Light Emission in Advanced Si and SiGe Bipolar Transistors", "Microelectronic Engineering", 1991, pp. 23-26, vol. 15.

Zdanowski, Marek, "Pulse operating up-converting phosphor LED", "Electron Technol.", 1978, pp. 49-61, vol. 11, No. 3.

Zhiming, Chen, et al., "Amorphous thin film white-LED and its light-emitting mechanism", "Conference Record of the 1991 International Display Research Conference", Oct. 1991, pp. 122-125.

Apr. 15, 2009 Office Action in U.S. Appl. No. 11/264.124, issued by Abu I Kalam.

Dec. 16. 2004 Office Action in U.S. Appl. No. 10/623,198, issued by Thao X. Le.

Forrest, S. et al., "Organic emitters promise a new generation of displays", "Laser Focus World", Feb. 1995, pp. 99-107.

Jun. 26, 2007 Office Action in U.S. Appl. No. 10/623,198, issued by Thao X. Le.

LEDs and Laser Diodes, Electus Distribution, copyright 2001, available at URL:http://www.jaycar.com.au/images_uploaded/ledlaser.Pdf.

McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.

McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.

Nov. 30. 2010 Office Action in U.S. Appl. No. 12/131,118.

Foreign Office Action dated May 2, 2013 for Chinese Appln. No. 200980153464.3.

International Search Report and Written Opinion for PCT/US2012/059505, dated Mar. 29, 2013 (16 pages).

U.S. Appl. No. 61/054,399, filed May 19, 2008.

(56) References Cited

OTHER PUBLICATIONS

International Search Report and Written Opinion dated Mar. 1, 2010 for International Application No. PCT/US2009/069477.
Non-Final Office Action dated Apr. 18, 2011 for U.S. Appl. No. 12/639,688.
Final Office Action dated Oct. 7, 2011 or U.S. Appl. No. 12/639,688.
Non-Final Office Action dated Mar. 27, 2012 for U.S. Appl. No. 12/639,688.
Notice of Allowance dated Oct. 4, 2012 for U.S. Appl. No. 12/639,688.
Supplementary European Search Report and Search Opinion dated Aug. 30, 2012 for EP Application No. 09837049.7.
Foreign Office Action dated Dec. 3, 2013 for Japanese Appln. No. 2011-544516.
International Report on Patentability dated Apr. 15, 2014 for PCT Appln. No. PCT/US2012/059505.

* cited by examiner

WAVELENGTH CONVERSION COMPONENT WITH IMPROVED PROTECTIVE CHARACTERISTICS FOR REMOTE WAVELENGTH CONVERSION

FIELD

This disclosure relates to light emitting devices that utilize remote wavelength conversion, and particularly to a wavelength conversion component for a light emitting device.

BACKGROUND

White light emitting LEDs ("white LEDs") are known and are a relatively recent innovation. It was not until LEDs emitting in the blue/ultraviolet part of the electromagnetic spectrum were developed that it became practical to develop white light sources based on LEDs. As taught, for example, in U.S. Pat. No. 5,998,925, white LEDs include one or more phosphor materials, that is photo-luminescent materials, which absorb a portion of the radiation emitted by the LED and re-emit light of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor material combined with the light emitted by the phosphor provides light which appears to the eye as being nearly white in color.

The phosphor typically resides within a wavelength conversion layer, in which phosphor material is mixed with a light transmissive carrier material, typically a plastics material. The wavelength conversion layer is operable to absorb a proportion of the blue light generated by the LEDs and convert it to light of a different wavelength by a process of photoluminescence. The combination of the different wavelength light produced by the phosphor-based wavelength conversion layer (e.g., yellow light) combined with the residue blue light that passes through the wavelength conversion layer forms light that appears white to the human eye.

A problem with existing wavelength conversion components is the degradation of the wavelength conversion layer when exposed to external environmental conditions. As noted above, the wavelength conversion layer is typically composed of a mixture of a phosphor material and a plastics carrier material. When the plastic-based wavelength conversion layer is exposed to moisture (e.g., mixture of air and water), oxygen, or other environmental contaminants, light energy being absorbed by the wavelength conversion layer may cause the contaminants to initiate chemical reactions with the phosphor material leading to accelerated degradation of the wavelength conversion layer.

The effect of water absorption on photoluminescence varies between phosphor compositions and can be more pronounced for silicate-based phosphor materials which are able to more readily form water soluble compounds. The absorption of water can occur even when the phosphor material is encapsulated in a polymer binder (e.g., carrier material/binding material), such as silicone, and a reduction in light emission of ~10% may occur for a device with an ortho-silicate phosphor that is operated in a humid environment (e.g. ≤80% relative humidity) at a temperature of 25° C. for more than 200 hours.

Moreover, an exposed wavelength conversion layer may be prone to handling damage, such as surface scratches, which also degrade the performance and lifetime of the wavelength conversion layer over time.

Therefore, there is a need for an improved approach to implement photo-luminescent materials for a lighting apparatus which addresses these and other problems with the prior implementations.

SUMMARY

Embodiments of the invention concern wavelength conversion components for remote wavelength conversion. In some embodiments, the wavelength conversion component includes a first light transmissive hermetic substrate, a second light transmissive hermetic substrate, and a wavelength conversion layer comprising photo-luminescent material located between the first light transmissive hermetic substrate and the second light transmissive hermetic substrate, wherein the first light transmissive hermetic substrate and the second light transmissive hermetic substrate form a barrier to a first surface and a second surface of the wavelength conversion layer.

In some embodiments, the wavelength conversion component may further include a sealant material disposed around an outer edge of a sandwich structure formed by the first light transmissive substrate, the wavelength conversion layer, and the second light transmissive substrate, wherein the sealant material hermetically seals an outer edge wavelength conversion layer.

In some embodiments, a method for manufacturing a wavelength conversion component for a light emitting device may include depositing a wavelength conversion layer on a first light transmissive hermetic substrate, depositing a second light transmissive hermetic substrate onto the wavelength conversion layer, such that the wavelength conversion layer is located between the first light transmissive hermetic substrate and the second light transmissive hermetic substrate, and curing the first light transmissive hermetic substrate, the wavelength conversion layer, and the second light transmissive hermetic substrate.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood light emitting devices and wavelength conversion components in accordance with the invention will now be described, by way of example only, with reference to the accompanying drawings in which like reference numerals are used to denote like parts, and in which.

DETAILED DESCRIPTION

Various embodiments are described hereinafter with reference to the figures. It should be noted that the figures are not necessarily drawn to scale. It should also be noted that the figures are only intended to facilitate the description of the embodiments, and are not intended as an exhaustive description of the invention or as a limitation on the scope of the invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiment" or "in other embodiments" in various places throughout this specification are not necessarily referring to the same embodiment or embodiments.

For the purposes of illustration only, the following description is made with reference to photo-luminescent material embodied specifically as phosphor materials. However, the invention is applicable to any type of photo-luminescent material, such as either phosphor materials or quantum dots. A quantum dot is a portion of matter (e.g. semiconductor) whose excitons are confined in all three spatial dimensions that may be excited by radiation energy to emit light of a particular wavelength or range of wavelengths. As such, the invention is not limited to phosphor based wavelength conversion components unless claimed as such.

According to some embodiments, wavelength conversion components for remote wavelength conversion are provided in which a wavelength conversion layer is "sandwiched" between two light transmissive hermetic substrates. The light transmissive hermetic substrates form a barrier that protects the wavelength conversion layer from exposure to external environmental conditions. The wavelength conversion component may further include a sealant material disposed around an outer edge of the sandwich structure, where the sealant material hermetically seals an outer edge wavelength conversion layer.

In this way, the embodiments of the invention protects against the degradation of the wavelength conversion layer, since the hermetic substrates and/or sealant material will prevent exposure to external environmental conditions. Moreover, this arrangement also protects against handling damage that may occur to the wavelength conversion layer, such as surface scratches, which also degrades the performance and lifetime of the wavelength conversion layer over time. Additionally, the glass acts as a UV filter, blocking UV light that may potentially damage the wavelength conversion layer.

Figure 1A:
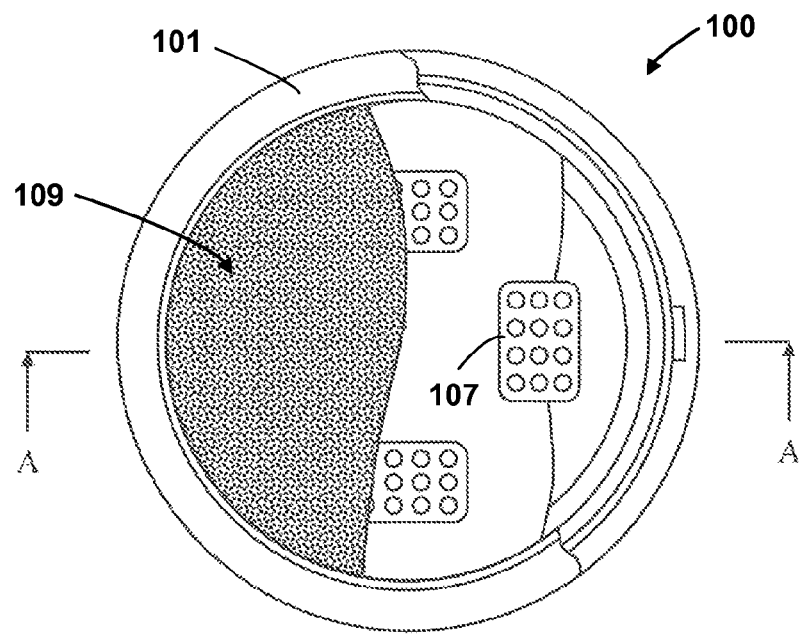
FIGS. 1A-B illustrates a schematic partial cutaway plan and sectional views of a known light emitting device that utilizes remote wavelength conversion.
Figure 1B:
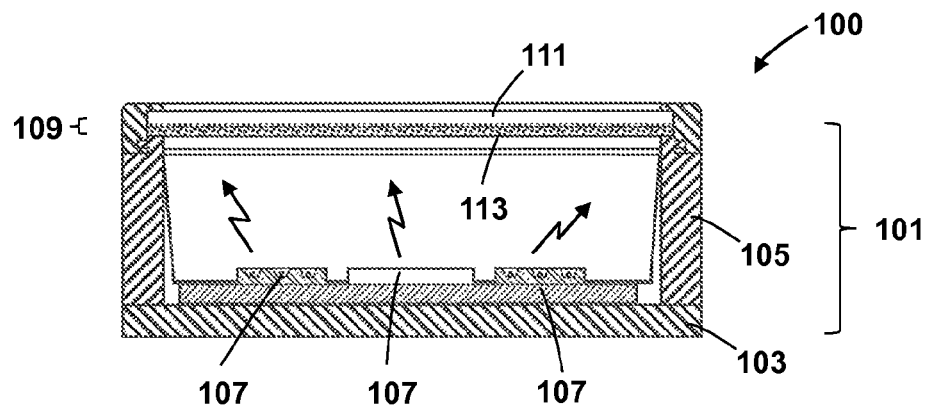

An example light emitting device that utilizes a remote wavelength conversion component will now be described with reference to FIGS. 1A and 1B which show a schematic partial cutaway plan and sectional views of the device. The device 100 comprises a hollow cylindrical body 101 with a base 103 and sidewalls 105. The device 100 further comprises a plurality of blue light emitting LEDs (blue LEDs) 107 that are mounted to the base 105 of the device 100. The LEDs 107 may be configured in various arrangements.

The device 100 includes a wavelength conversion component 109 that is operable to absorb a proportion of the blue light generated by the LEDs 107 and convert it to light of a different wavelength by a process of photoluminescence. The wavelength conversion component 109 is positioned remotely to the LEDs 107. The term "remotely" and "remote" refer to a spaced or separated relationship. For example, the wavelength conversion component 109 may be positioned a distance of at least 1 cm from the LEDs 107.

The wavelength conversion component 109 typically comprises a light transmissive substrate 111 and a wavelength conversion layer 113 in contact with the light transmissive substrate 111. The wavelength conversion component 109 may be configured such that the wavelength conversion layer 113 is facing the LEDs 107 as illustrated in FIG. 1. Alternatively, the wavelength conversion component 109 may be configured such that the light transmissive substrate 111 is facing the LEDs 107. Without the inclusion of the inventive arrangement having the light transmissive hermetic substrates, the wavelength conversion layer 113 is subject to possible external environmental intrusions.

Figure 2:
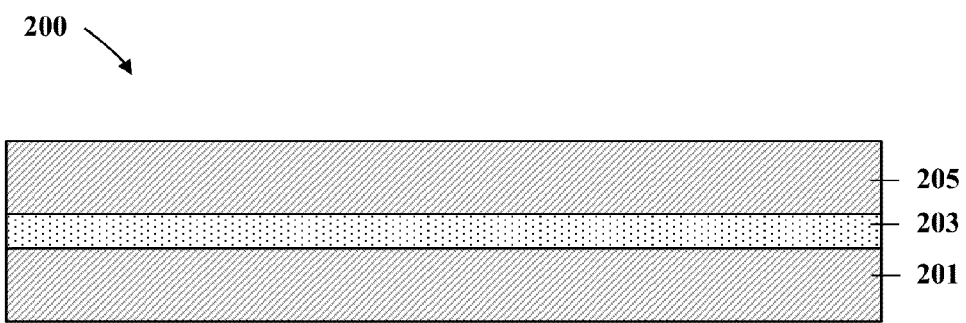
FIG. 2 illustrates a wavelength conversion component according to some embodiments.

FIG. 2 illustrates a wavelength conversion component according to some embodiments which protects against such external environmental intrusions. The wavelength conversion component 200 comprises a first light transmissive hermetic substrate 201, a second light transmissive hermetic substrate 205, and a wavelength conversion layer 203. The wavelength conversion layer 203 is located between the first light transmissive hermetic substrate 201 and the second light transmissive hermetic substrate 203. The first light transmissive hermetic substrate 201 and the second light transmissive hermetic substrate 205 provide a barrier to a first surface of the wavelength conversion layer 203 and a second surface of the wavelength conversion layer 203.

The surfaces of the wavelength conversion layer 203 may be in direct contact with the light transmissive hermetic substrates 201, 205 as depicted in FIG. 2. The term "direct contact" means that there are no intervening layers or air gaps. Introducing intervening layers or air gaps at the interface between the wavelength conversion layer 203 and either of the light transmissive hermetic substrates 205 may alter the behavior of light traveling through the wavelength conversion component 200. As such, creating direct contact at the interface between the wavelength conversion layer 203 and either light transmissive hermetic substrate 201, 205 may be preferred in order to safeguard against non-ideal behavior of light transmitting through the wavelength conversion component 200. Furthermore, a light transmissive hermetic substrate 201, 205 in direct contact with a surface of the wavelength conversion layer 203 creates a barrier against environmental contaminants at that interface.

In some embodiments, the wavelength conversion component may be a planar circular disc. In other embodiments, the wavelength conversion component may comprise other geometries such as being convex or concave in form such as for example being dome shaped shell or a cylindrical tube.

Each light transmissive hermetic substrate 201, 205 must be substantially transmissive to light in the visible spectrum (e.g. 380-740 nm). At such wavelengths, the light transmissive hermetic substrates 201, 205 should ideally be able to transmit at least 90% of visible light. Each light transmissive hermetic substrate 201, 205 should also be hermetic. The term "hermetic" refers to being substantially impermeable to water, gas, or other environmental contaminants. Examples of light transmissive hermetic substrates include such inorganic materials as glass (e.g., traditional, borosilicate, tempered) and sapphire.

Figure 4:
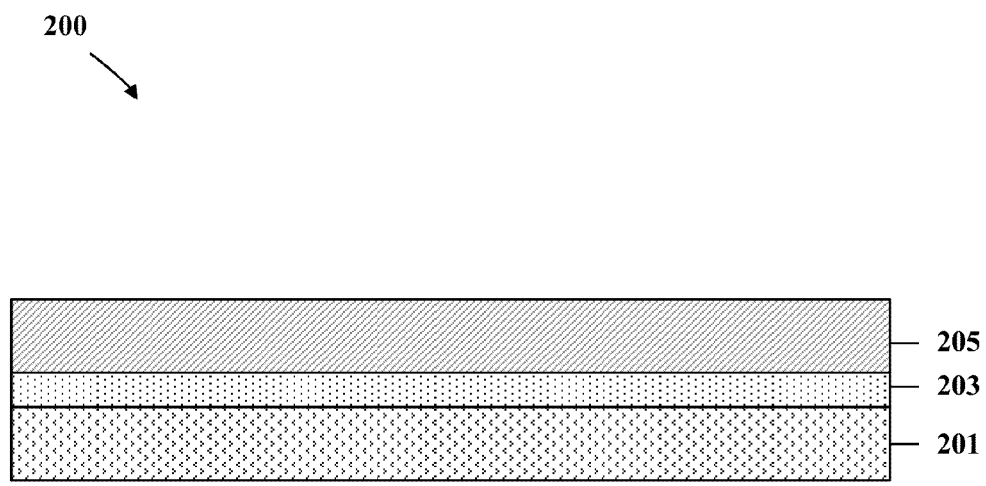
FIG. 4 illustrates the wavelength conversion component of FIG. 2 according to some other embodiments.

Furthermore, the first light transmissive hermetic substrate 201 and the second light transmissive hermetic substrate 205 should have substantially similar indices of refractions in order to ensure proper transmission of light through the wavelength conversion component 200. In some embodiments, the first light transmissive hermetic substrate 201 and the second light transmissive hermetic substrate 205 may be composed of the same material in order to match indices of refraction as illustrated in FIG. 2. In other embodiments, the first light transmissive hermetic substrate 201 and the second light transmissive hermetic substrate 205 may be composed of different materials with substantially similar indices of refraction as illustrated in FIG. 4.

Additionally, the first light transmissive hermetic substrate 201 and the second light transmissive hermetic substrate 205 should have substantially similar coefficients of thermal expansion. At high temperatures, the wavelength conversion component 200 may experience structural degradation due to mismatched coefficients of thermal expansion of the light transmissive hermetic substrates 201, 205. Thus, maintaining substantially similar coefficients of thermal expansion between the light transmissive hermetic substrates 201, 205 will help preserve the structural integrity of the wavelength conversion component 200. In some embodiments, the first light transmissive hermetic substrate 201 and the second light transmissive hermetic substrate 205 may be composed of the same material in order to match coefficients of thermal expansion as illustrated in FIG. 2. In other embodiments, the first light transmissive hermetic substrate 201 and the second light transmissive hermetic substrate 205 may be composed of different materials with substantially similar coefficients of thermal expansion as illustrated in FIG. 4.

The wavelength conversion layer 203 of the wavelength conversion component 200 comprises a photo-luminescent material. In some embodiments, the wavelength conversion layer 203 may comprise one or more phosphor materials mixed with a carrier material. In other embodiments, the wavelength conversion layer 203 may also include other photo-luminescent material such as quantum dots.

When the wavelength conversion layer 203 comprises a phosphor material mixed with a carrier material, the carrier material must be substantially transmissive to light in the visible spectrum (e.g. 380-740 nm). At such wavelengths, the carrier material should be able to transmit at least 90% of visible light. Such carrier materials may include a polymer resin, a monomer resin, an acrylic, an epoxy, a silicone or a fluorinated polymer.

In some embodiments the carrier material may be composed of a U.V. curable material. In some other embodiments, the carrier material may be composed of a thermally curable material.

Furthermore, when the wavelength conversion layer 203 comprises a phosphor material mixed with a carrier material, the carrier material should have an index of refraction that is substantially similar to the indices of refraction of the light transmissive hermetic substrates in order to ensure proper transmission of light through the wavelength conversion component 200. Additionally, when the wavelength conversion layer 203 comprises a phosphor material mixed with a carrier material, the carrier material should have a coefficient of thermal expansion that is substantially similar to the coefficient of thermal expansion of the light transmissive hermetic substrates in order to preserve the structural integrity of the wavelength conversion component 200.

For a wavelength conversion layer 203 comprising phosphor material mixed with a carrier material, the phosphor material can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 B2 "Silicate-based green phosphors", U.S. Pat. No. 7,601,276 B2 "Two phase silicate-based yellow phosphors", U.S. Pat. No. 7,655,156 B2 "Silicate-based orange phosphors" and U.S. Pat. No. 7,311,858 B2 "Silicate-based yellow-green phosphors". The phosphor can also comprise an aluminate-based material such as is taught in co-pending patent application US2006/0158090 A1 "Novel aluminate-based green phosphors" and U.S. Pat. No. 7,390,437 B2 "Aluminate-based blue phosphors", an aluminum-silicate phosphor as taught in co-pending application US2008/0111472 A1 "Aluminum-silicate orange-red phosphor" or a nitride-based red phosphor material such as is taught in co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can comprise any phosphor material including nitride and/or sulfate phosphor materials, oxy-nitrides and oxy-sulfate phosphors or garnet materials (YAG).

The wavelength conversion component 200 including the wavelength conversion layer 203 sandwiched between two light transmissive hermetic substrates 201, 205 provides several advantages. The light transmissive hermetic substrates 201, 205 protect the surfaces of the wavelength conversion layer 203 from exposure to environmental contaminants. This limits the potential of such environmental contaminants to potentially initiate a chemical reaction within the wavelength conversion layer 203 that leads to accelerated degradation of that layer. The exposure of the wavelength conversion layer to moisture (e.g., the mixture of air and gas) significantly increases the potential for accelerated degradation of the phosphor. Thus, the glass provides a barrier against exposure to moisture by eliminating the introduction of water into the wavelength conversion layer. Although an outer edge of the wavelength conversion layer 203 is still exposed in this embodiment, the path of intrusion for environmental contaminants through the exposed outer edge of the wavelength conversion layer 203 is so limited (due to the minimal thickness of the wavelength conversion layer 203) that the potential for accelerated degradation of the wavelength conversion layer 203 due to environmental contaminants is minimized.

Additionally, having a light transmissive hermetic substrate 201, 205 on each surface of the wavelength conversion layer 203 protects against handling damage, such as surface scratches, which also degrade the performance and lifetime of the wavelength conversion layer over time. Furthermore, the light transmissive hermetic substrates 201, 205 act as a UV filter, thereby blocking UV light that may potentially damage the wavelength conversion layer.

Figure 3:
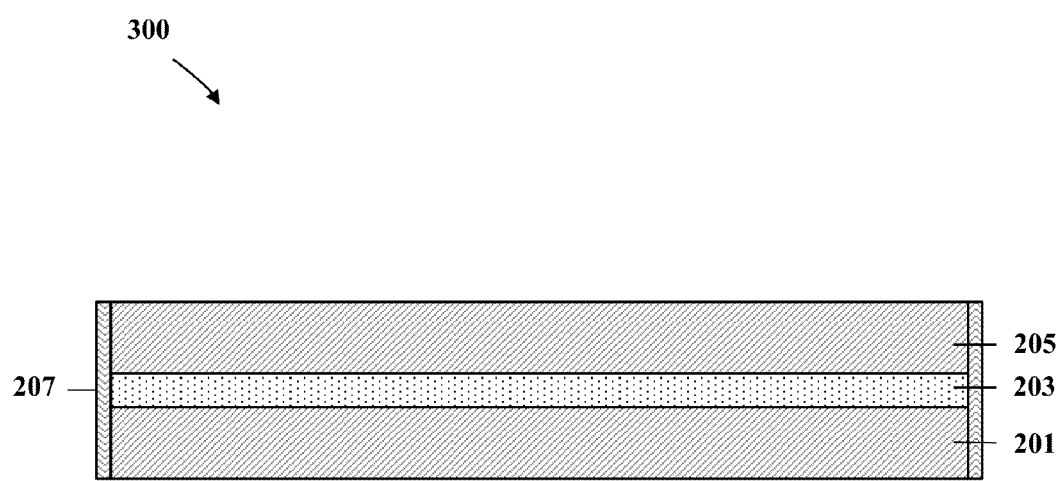
FIG. 3 illustrates a wavelength conversion component according to some other embodiments.

In some embodiments, the wavelength conversion layer may be further hermetically sealed at an outer edge. FIG. 3 illustrates a wavelength conversion component 300 according to some other embodiments. The wavelength conversion component 300 in FIG. 3 includes all the features already described above with respect to FIG. 2. For purposes of discussion, only new features of the wavelength conversion component 300 in FIG. 3 will be discussed. In addition to the first light transmissive hermetic substrate 201, second light transmissive hermetic substrate 205 and the wavelength conversion layer 203 described above, the wavelength conversion component 300 in FIG. 3 further includes a hermetic sealant material 207 disposed around an outer edge of a sandwich structure formed by the first light transmissive substrate 201, the wavelength conversion layer 203, and the second light transmissive substrate 205.

The sealant material 207 may comprise any material that may be used to form a hermetic seal at the outer edge of the wavelength conversion layer 203. As already discussed above, the term "hermetic" refers to being substantially impermeable to water, gas, or other environmental contaminants. Thus the sealant material 207 forms a protective layer around the outer edge of the wavelength conversion layer 203, such that the outer edge is impermeable to environmental contaminants. For example, glass solder or invar (e.g., FeNi36 Nickel Steel Alloy with a very low coefficient of thermal expansion) may be used as the sealant material 207.

The sealant material 207 should have a substantially similar coefficient of thermal expansion to that of the light transmissive hermetic substrates 201, 205 and wavelength conversion layer 203, or a high degree of elasticity. A substantially similar coefficient of thermal expansion for the sealant material 207 preserves the hermetic seal formed around the outer edge of the wavelength conversion layer 203 for various operating temperatures of the wavelength conversion component 300. A high degree of elasticity of the sealant material 207 allows for flexibility at high temperatures such that the hermetic seal formed around the outer edge of the wavelength conversion layer 203 may be preserved.

By introducing a sealant material 207 around the outer edge of the wavelength conversion component 300, the wavelength conversion layer 203 may be completely hermetically sealed. Thus, regardless of the dimensions of the wavelength conversion layer 203, it is protected from environmental contaminants.

Figure 5A:
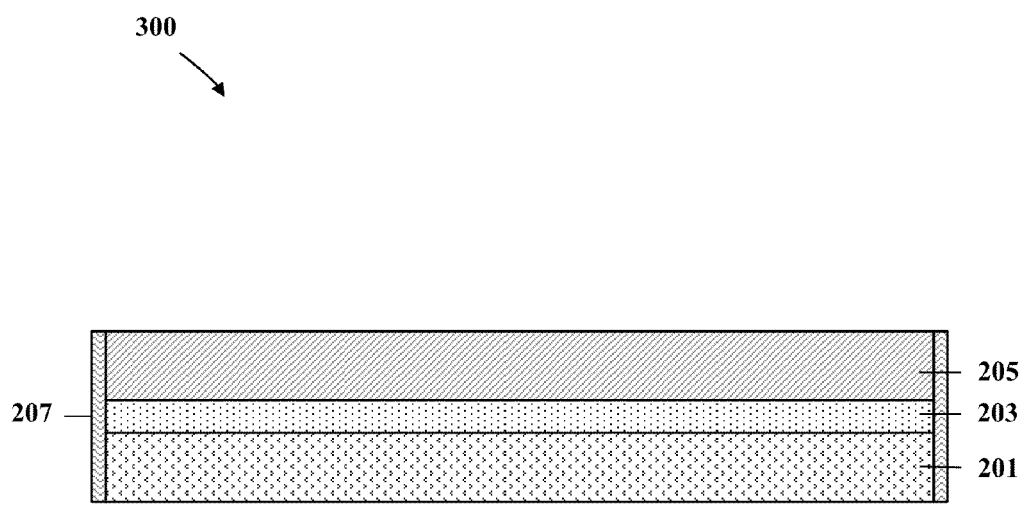
FIGS. 5A-B illustrate the wavelength conversion component in FIG. 3 according to some other embodiments.

In some embodiments, the first light transmissive hermetic substrate 201 and the second light transmissive hermetic substrate 205 may be composed of the same material in order to match indices of refraction as illustrated in FIG. 3. In other embodiments, the first light transmissive hermetic substrate 201 and the second light transmissive hermetic substrate 205 may be composed of different materials with substantially similar indices of refraction as illustrated in FIG. 5A.

In some embodiments, the first light transmissive hermetic substrate 201 and the second light transmissive hermetic substrate 205 may be composed of the same material in order to match coefficients of thermal expansion as illustrated in FIG. 3. In other embodiments, the first light transmissive hermetic substrate 201 and the second light transmissive hermetic substrate 205 may be composed of different materials with substantially similar coefficients of thermal expansion as illustrated in FIG. 5A.

Figure 5B:
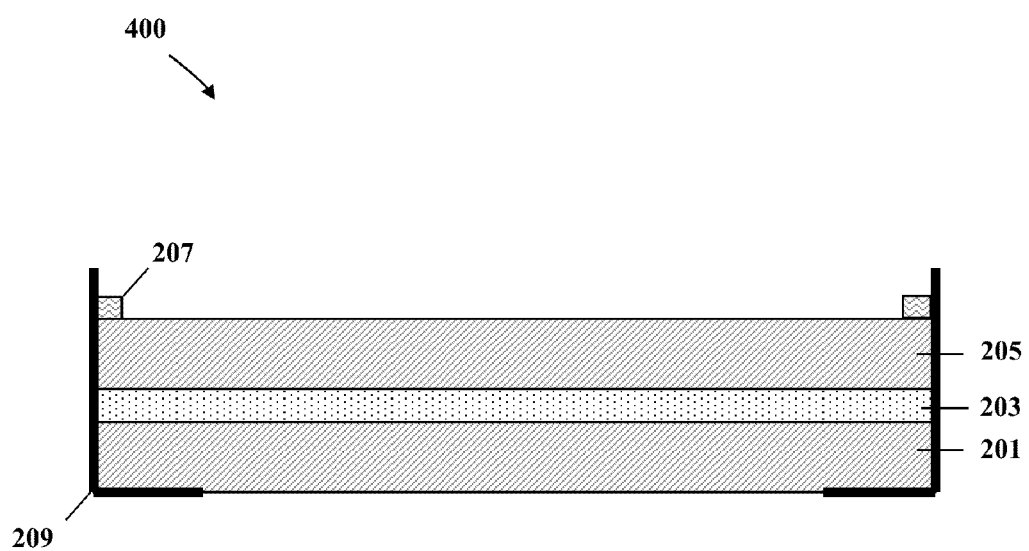

In other embodiments, the outer edge of the wavelength conversion layer may be hermetically sealed using a hermetic holding structure. FIG. 5B illustrates a cross-sectional view of a wavelength conversion component 400 that is hermetically sealed using a hermetic holding structure 209 according to some other embodiments.

The wavelength conversion component 400 in FIG. 5B includes a first light transmissive hermetic substrate 201, a wavelength conversion layer 203, and a second light transmissive hermetic substrate 205 as described above in FIG. 2. The wavelength conversion component 400 is further disposed within a hermetic holding structure 209 that is in direct contact with an outer edge of the first light transmissive substrate 201, an outer edge of the wavelength conversion layer 203, and an outer edge of the second light transmissive substrate 205. In some embodiments, each layer of the wavelength conversion component 400 could be fabricated within the hermetic holding structure 209 to ensure that the structure 209 forms a hermetic seal around the outer edge of the wavelength conversion component 400. To ensure hermetic sealing of the wavelength conversion layer 203, a sealant material 207 may be applied to the outer edge of a top surface of the second light transmissive hermetic substrate 207. The sealant material 207 need not be applied anywhere else on the wavelength conversion component 400 because the combination of the light transmissive hermetic substrates 201, 205 and the hermetic sealing structure 209 provides hermetic sealing to protect all other exposed portions of the wavelength conversion layer 203. The sealant material 207 should again have a substantially similar coefficient of thermal expansion to that of the light transmissive hermetic substrates 201, 205.

The hermetic holding structure 209 can as indicated in FIG. 5B comprise an annular component including base and wall portions, with an optical window to allow light to transmit through the wavelength conversion component 400. Because light transmitting through the wavelength conversion component 400 need not pass through the hermetic holding structure 209, the hermetic holding structure 209 can be composed of any material that is hermetic, regardless of its ability to transmit light in the visible range. For example, the hermetic holding structure 209 may be composed of steel, invar (a nickel steel alloy with a low thermal expansion coefficient) or any other opaque material that is hermetic.

Figure 6:
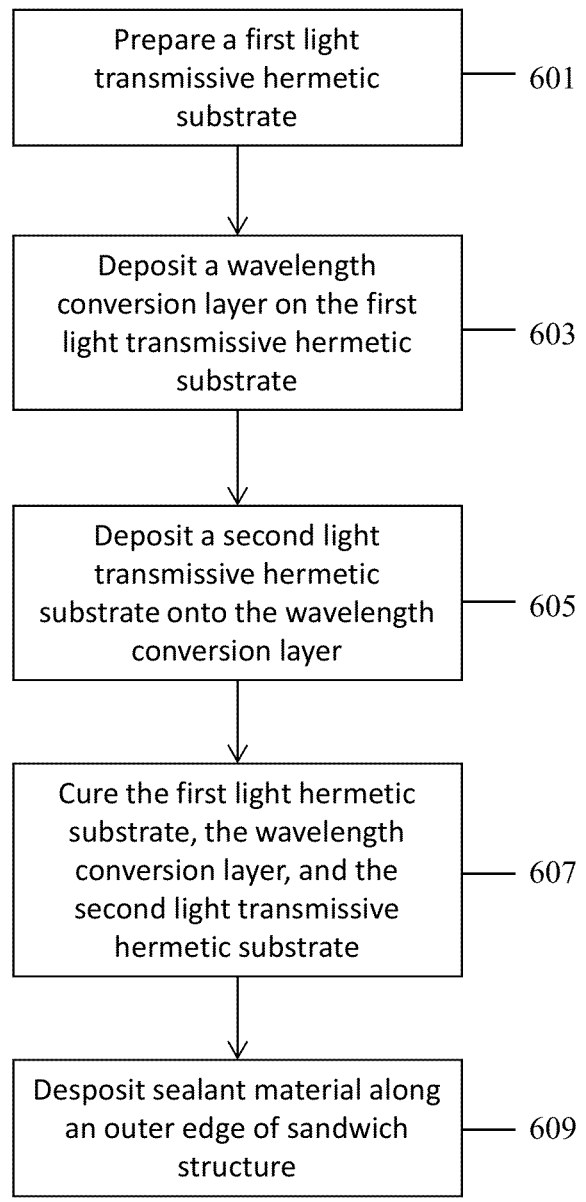
FIG. 6 is a flow diagram illustrating a method of manufacturing a wavelength conversion component in accordance with some embodiments of the present invention.

Several methods exist for manufacturing a wavelength conversion component in accordance with the embodiments described above. FIG. 6 is a flowchart illustrating a method of manufacturing a wavelength conversion component in accordance with some embodiments of the present invention. Initially, a first light transmissive hermetic substrate may undergo surface preparation as described at 601. Surface preparation may include steps necessary to remove contaminants prior to deposition of another layer.

A wavelength conversion layer is then deposited on the first light transmissive hermetic substrate as described at 603. In some embodiments, the wavelength conversion layer may be a liquid mixture of phosphor material and carrier material. The phosphor material, which is in powder form, is thoroughly mixed in known proportions with a liquid light transmissive carrier material to form a suspension. The resulting liquid wavelength conversion layer is deposited directly onto the first light transmissive hermetic substrate. The wavelength conversion layer is preferably deposited by screen printing though other printing or deposition techniques such as flexograph printing, gravure printing, pad printing, ink jet printing, slot die coating, spin coating, or doctor blading can be used.

A second light transmissive hermetic substrate is then placed onto the wavelength conversion layer as described at 605. The first light hermetic substrate, the wavelength conversion layer, and the second light transmissive hermetic substrate may then undergo curing as described at 607. Curing allows the liquid wavelength conversion layer to solidify. In some embodiments, the curing process may involve U.V. curing. In some other embodiments, the curing process may involve thermal curing.

Lastly, a sealant material may optionally be deposited along an outer edge of a sandwich structure formed by the first light transmissive substrate, the wavelength conversion layer, and the second light transmissive substrate as described at 609. The sealant forms a hermetic seal along the exposed outer edge of the wavelength conversion layer.

While FIG. 6 describes a method for manufacturing a wavelength conversion component in accordance with some embodiments of the invention, additional steps may be taken in the manufacturing process. FIGS. 7A-D illustrate a method for manufacturing a wavelength conversion component in accordance with some embodiments.

Figure 7A:
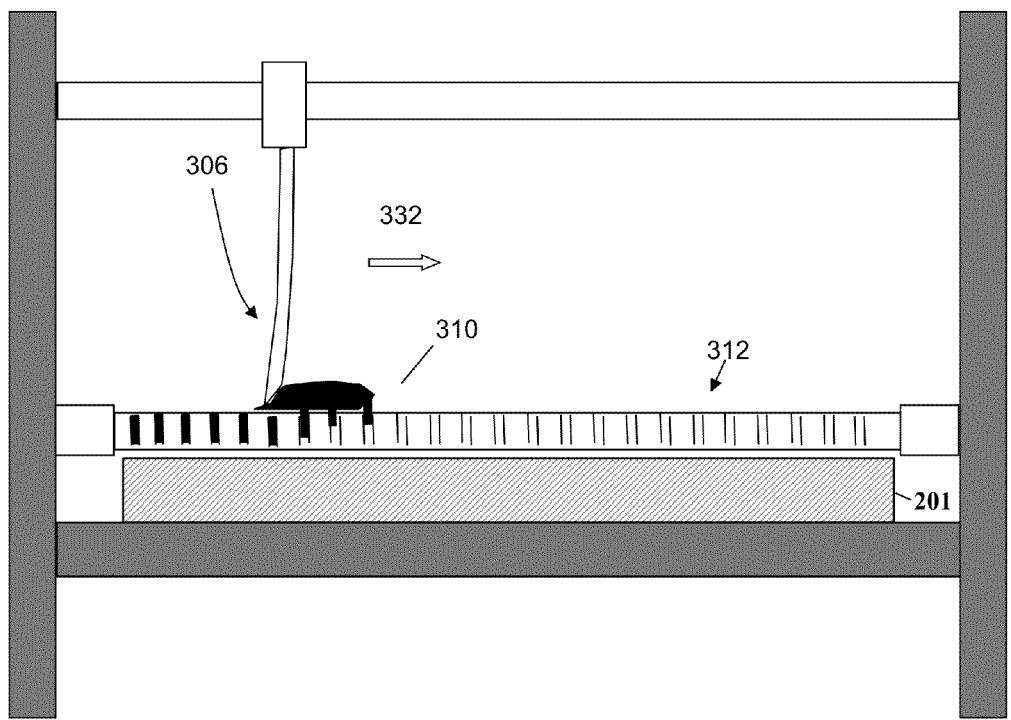
FIGS. 7A-E are views illustrating a method of manufacturing a wavelength conversion component in accordance with some embodiments of the present invention.
Figure 7B:
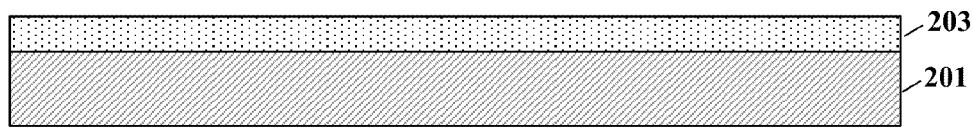

Initially, a first light transmissive hermetic substrate 201 may undergo surface preparation and a liquid wavelength conversion layer 203 (e.g., phosphor powder and liquid carrier material) may be deposited thereupon. The wavelength conversion layer 203 is preferably deposited by screen printing though other deposition techniques such as flexograph printing, gravure printing, pad printing, ink jet printing, slot die coating, spin coating, or doctor blading can be used. FIG. 7A illustrates a screen printing process, where a layer of photo-luminescent ink 310 is deposited onto a substrate 201, where a blade 306 (also referred to as a squeegee) is moved in the direction of arrow 332 to spread the ink 310 across a mesh screen 312 to form the material of the wavelength conversion layer 203. The first light transmissive hermetic substrate 201 and the liquid wavelength conversion layer 203 may then undergo a curing process to solidify the carrier material. The resulting structure is illustrated in FIG. 7B.

Figure 7C:
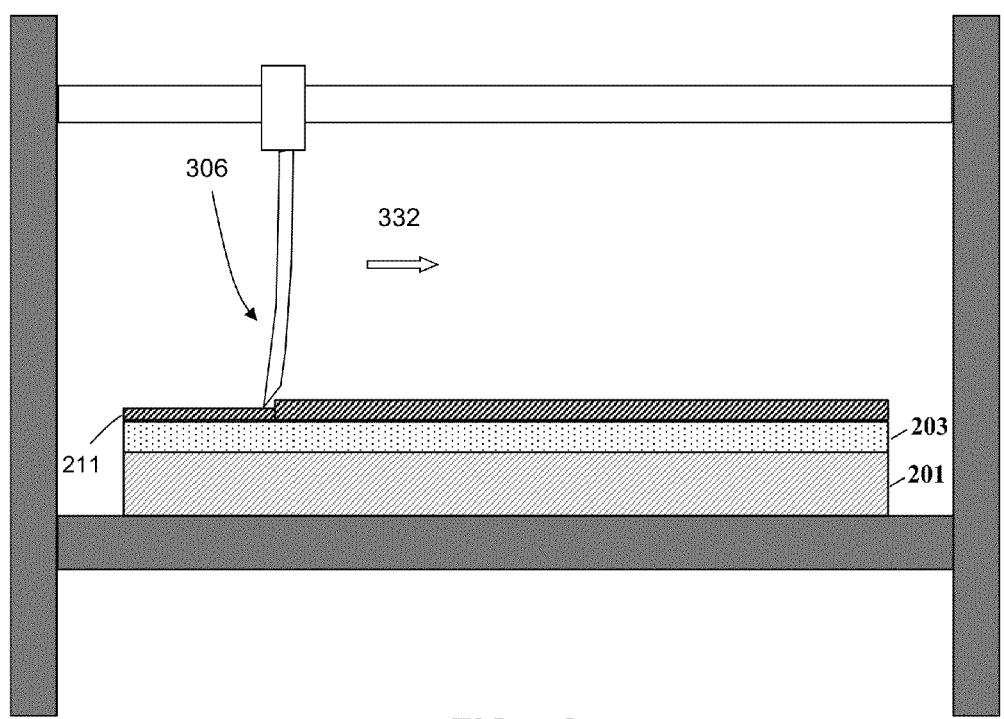

As shown in FIG. 7C, a thin layer of liquid carrier material 211 may then be deposited on top of the wavelength conversion layer 203, and excess carrier material may be removed using a flexible blade 306 (squeegee). Alternatively the thin layer of liquid carrier material may be deposited by flexograph printing, gravure printing, pad printing, ink jet printing, slot die coating, spin coating, or doctor blading can be used.

Figure 7D:
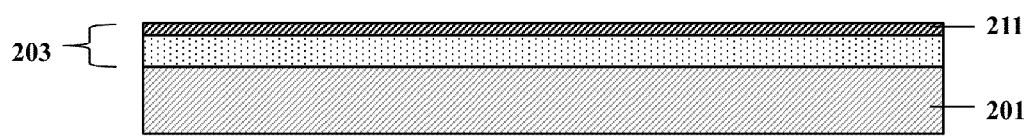

The resulting structure after removal of excess carrier material is illustrated in FIG. 7D. The thin layer of liquid carrier material 211 is used to ensure proper adhesion of a second light transmissive hermetic substrate. The thin layer of liquid carrier material 211 does not significantly affect any of the optical or thermal properties of the wavelength conversion layer 203, and becomes part of the wavelength conversion layer 203.

Figure 7E:
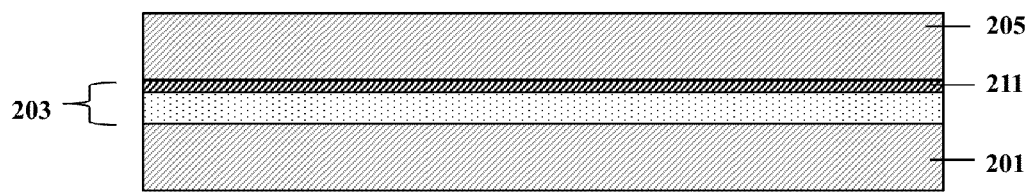

A second light transmissive hermetic substrate 205 may undergo surface preparation before being placed on the wavelength conversion layer 203 comprising the thin layer of liquid carrier material 211. The resulting structure is then cured to solidify the thin layer of carrier material 211. The resulting structure is a wavelength conversion component, as illustrated in FIG. 7E.

Figure 8A:
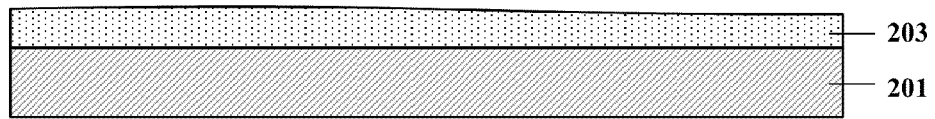
FIGS. 8A-D are views illustrating a method of manufacturing a wavelength conversion component in accordance with some other embodiments of the present invention.

FIGS. 8A-D illustrate views of a method for manufacturing a wavelength conversion component in accordance with some other embodiments. Initially, a first light transmissive hermetic substrate 201 may undergo surface preparation and a liquid wavelength conversion layer 203 (e.g. phosphor material powder and liquid carrier material) may be deposited thereupon. The wavelength conversion layer 203 is preferably deposited by screen printing though other deposition techniques such as flexograph printing, gravure printing, pad printing, ink jet printing, slot die coating, spin coating, or doctor blading can be used. The resulting structure is illustrated in FIG. 8A.

Figure 8B:
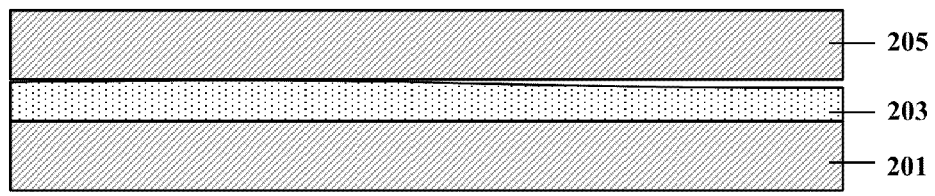
Figure 8C:
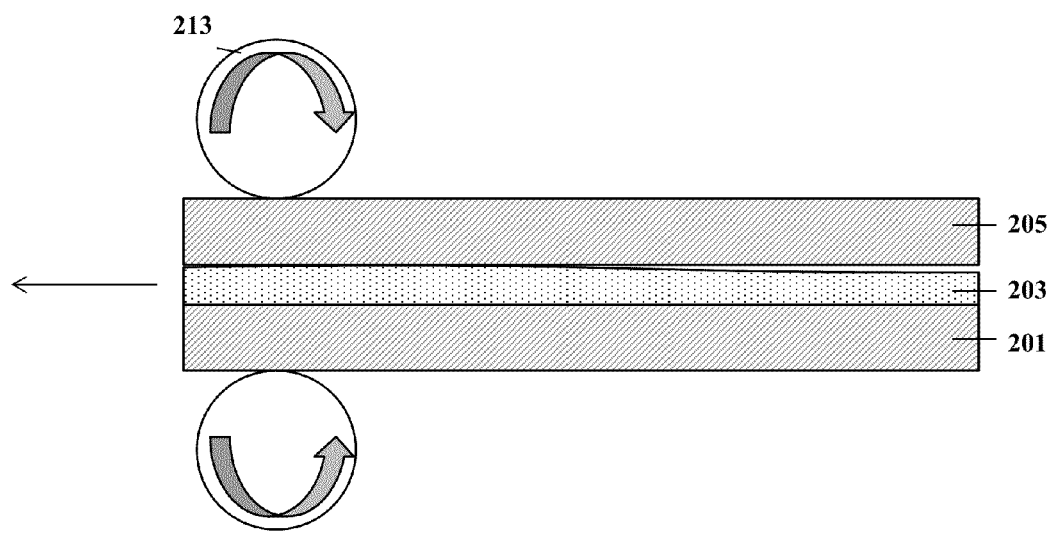

A second light transmissive hermetic structure 205 may then undergo surface preparation before being placed onto the liquid wavelength conversion layer 203 as illustrated in FIG. 8B. In order to ensure that the first light transmissive hermetic substrate 201 and second light transmissive hermetic substrate 205 are in direct contact with the liquid wavelength conversion layer 203, a lamination process may be applied as illustrated in FIG. 8C. The lamination process may comprise using rollers 213 to apply uniform pressure across both the first light transmissive hermetic substrate 201 and the second light transmissive hermetic substrate 205 in order to create direct contact between the substrates 201, 205 and the liquid wavelength conversion layer 203.

Figure 8D:
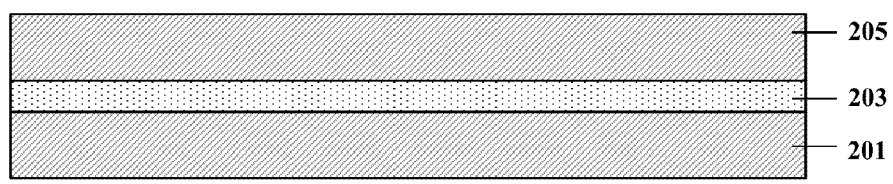

A final step of curing the first light transmissive hermetic substrate 201, the second light transmissive hermetic substrate 205, and liquid wavelength conversion layer 203 may be performed to solidify the wavelength conversion layer 203 as illustrated in FIG. 8D.

While the wavelength conversion components described above have two-dimensional configurations (e.g., generally planar shape), in some other embodiments it is possible for the wavelength conversion component to have a three-dimensional configuration for different applications. This is in contrast to the two-dimensional shape (e.g., generally planar shape) of the wavelength conversion components described above. Such three-dimensional components may be useful for applications where it is necessary or desired for light emitted from the light emitting device to be spread over a larger solid angle.

Figure 9A:
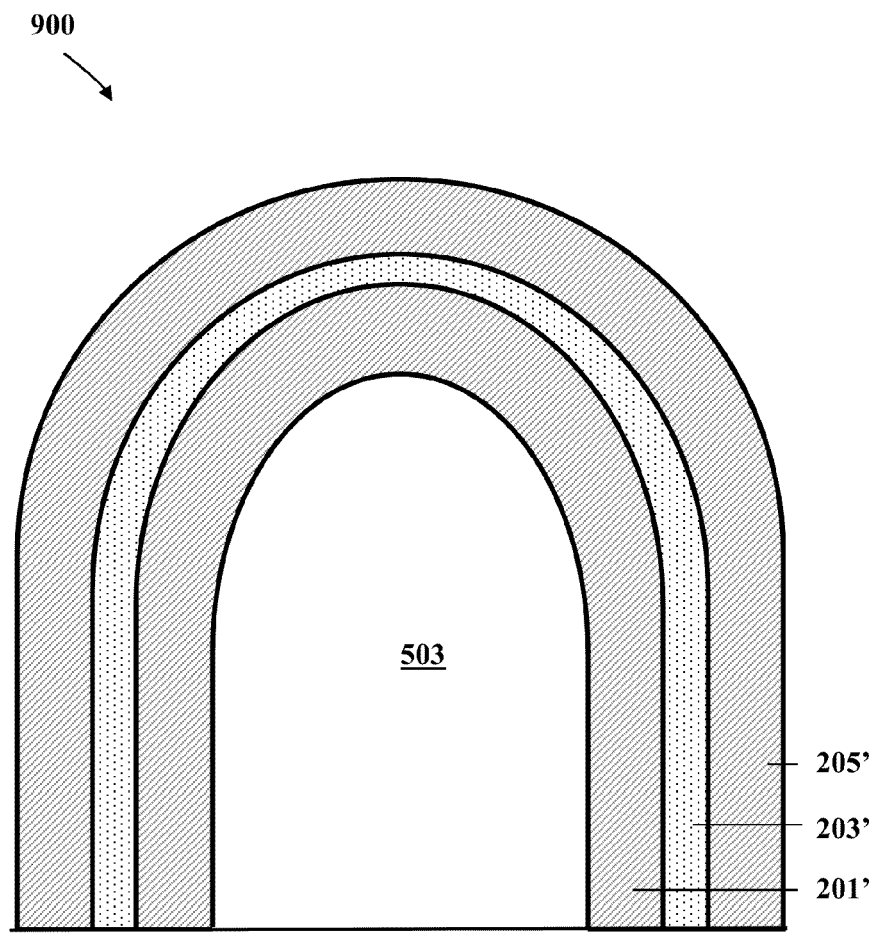
FIG. 9A illustrates a three-dimensional configuration of a wavelength conversion component in accordance with some embodiments.

FIG. 9A illustrates a wavelength conversion component 900 in accordance with some embodiments. The wavelength conversion component 900 of FIG. 9A is a three-dimensional configuration of the wavelength conversion component 200 of FIG. 2. For purposes of discussion, only features of the wavelength conversion component 900 of FIG. 9A that are new relative to the embodiments of FIG. 2 will be described.

Whereas the wavelength conversion component 200 in FIG. 2 has a two-dimensional shape (e.g., is substantially planar), the wavelength conversion component 900 of FIG. 9A has a three-dimensional shape (e.g., elongated dome shaped and/or ellipsoidal shell) whose inner surface defines an interior volume 503. The three-dimensional wavelength conversion component 900 in FIG. 9A includes a three-dimensional first light transmissive hermetic substrate 201', a three-dimensional wavelength conversion layer 203', and a three-dimensional second light transmissive hermetic substrate 205' rather than a planar first light transmissive hermetic substrate, a planar wavelength conversion layer, and a planar second light transmissive substrate.

Figure 9B:
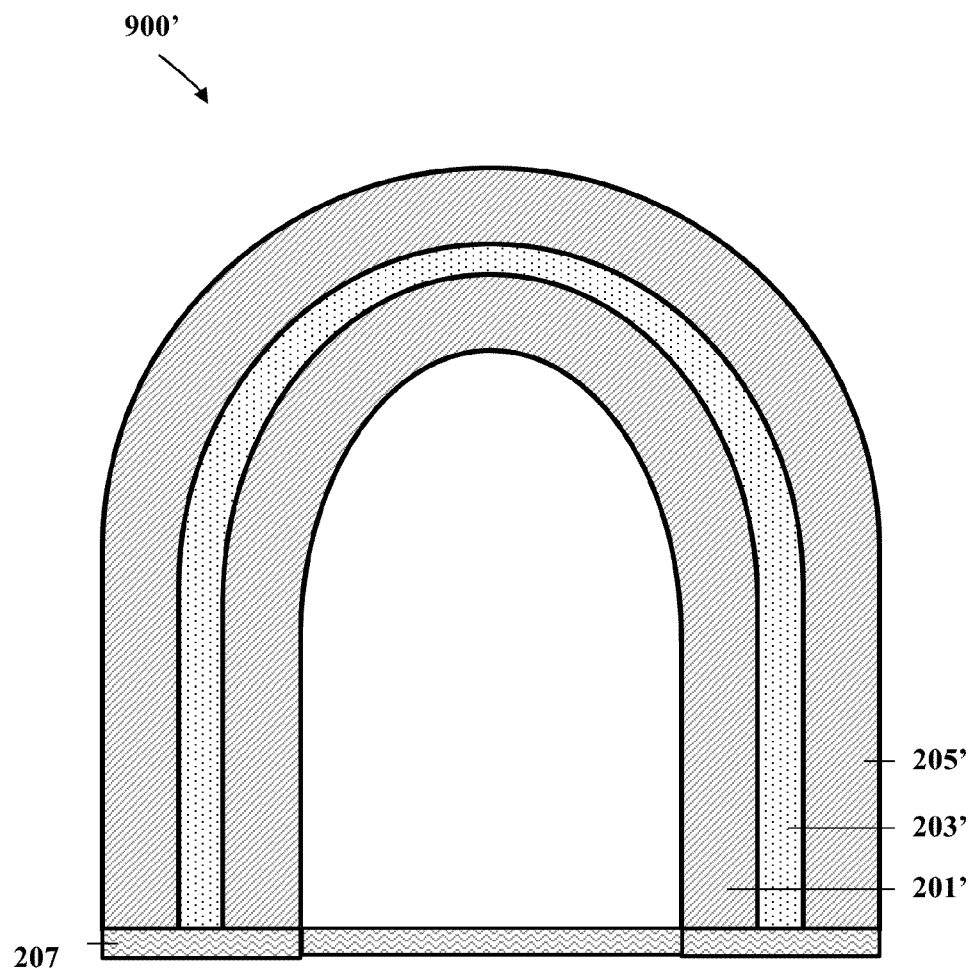
FIG. 9B illustrates a three-dimensional configuration of a wavelength conversion component in accordance with some embodiments.

FIG. 9B illustrates a cross-sectional of a wavelength conversion component 900' in accordance with some embodiments. The wavelength conversion component 900' of FIG. 9B is a three-dimensional configuration of the wavelength conversion component 300 of FIG. 3. For purposes of discussion, only features of the wavelength conversion component 900' of FIG. 9B that are new relative to the embodiments of FIG. 3 will be described.

Whereas the wavelength conversion component 300 in FIG. 3 has a two-dimensional shape (e.g., is substantially planar), the wavelength conversion component 900' of FIG. 9B has a three-dimensional shape (e.g., elongated dome shaped and/or ellipsoidal shell). The three-dimensional wavelength conversion component 900' in FIG. 9B includes a three-dimensional first light transmissive hermetic substrate 201', a three-dimensional wavelength conversion layer 203', and a three-dimensional second light transmissive hermetic substrate 205' rather than a planar first light transmissive substrate, a planar wavelength conversion layer, and a planar second light transmissive substrate. The wavelength conversion component 900' in FIG. 9B still includes a hermetic sealant material 207 disposed around an outer edge of a sandwich structure formed by the three-dimensional first light transmissive substrate 201', the three-dimensional wavelength conversion layer 203', and the three-dimensional second light transmissive substrate 205'.

Configuring the wavelength conversion component to be three-dimensional rather than two-dimensional may be useful for applications where it is necessary for light emitted from the light emitting device to be spread over a larger volume.

Figure 10A:
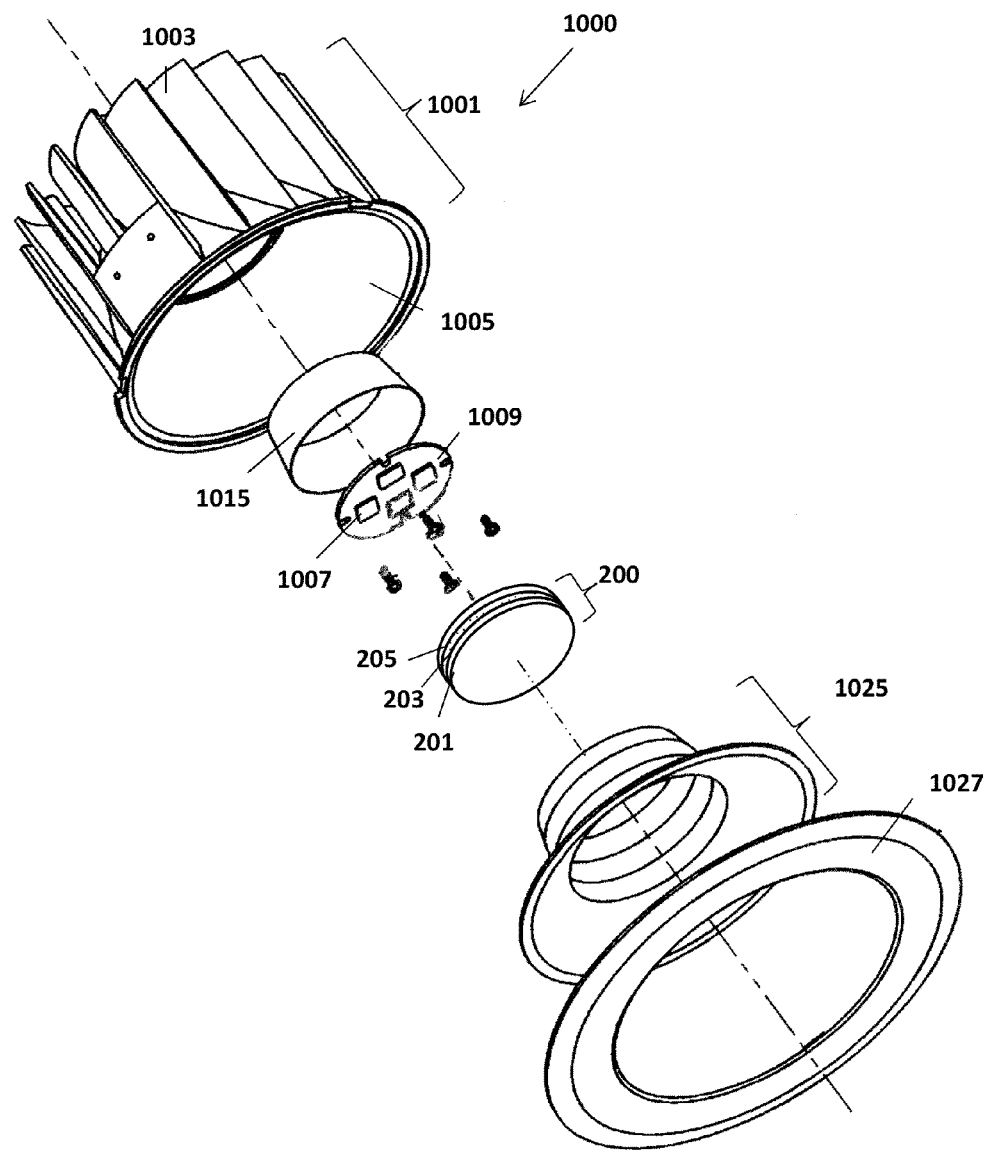
FIGS. 10A, 10B, and 10C illustrate an example of an application of a wavelength conversion component in accordance with some embodiments.
Figure 10B:
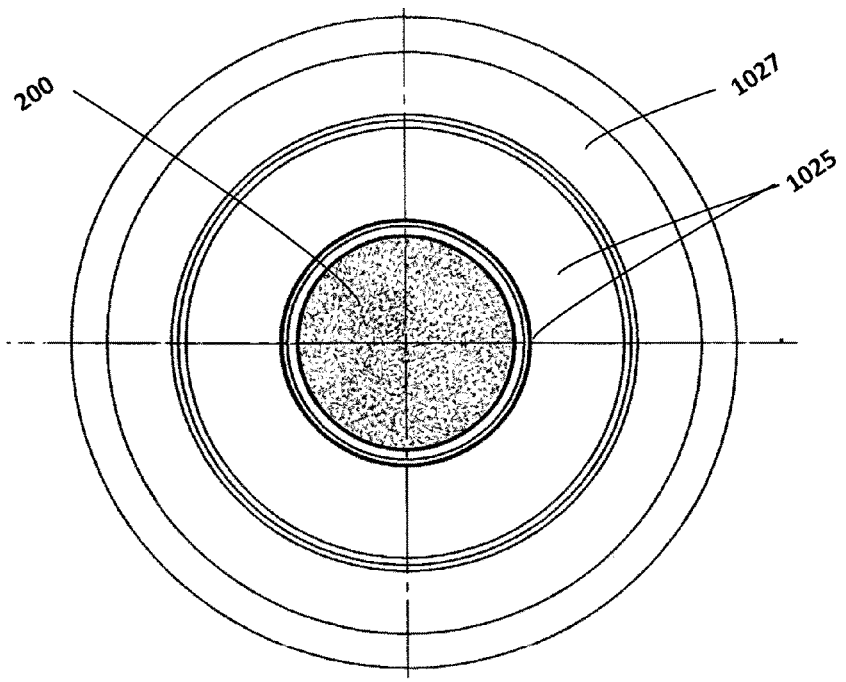
Figure 10C:
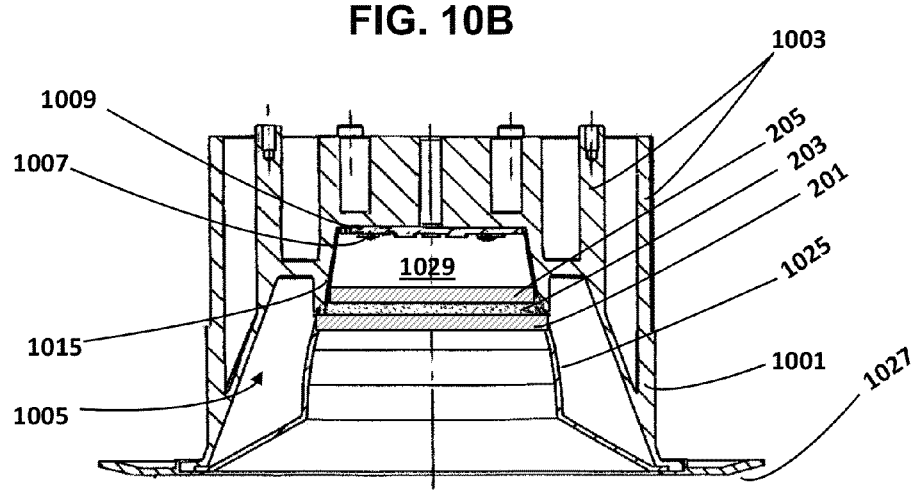

FIGS. 10A, 10B, and 10C illustrate an example of an application of a wavelength conversion component in accordance with some embodiments. FIG. 10A, 10B, and 10C illustrates an LED downlight 1000 that utilizes remote wavelength conversion in accordance with some embodiments. FIG. 10A is an exploded perspective view of the LED downlight 1000, FIG. 10B is an end view of the downlight 1000, and FIG. 10C is a sectional view of the downlight 1000. The downlight 1000 is configured to generate light with an emission intensity of 650-700 lumens and a nominal beam spread of 60° (wide flood). It is intended to be used as an energy efficient replacement for a conventional incandescent six inch downlight.

The downlight 1000 comprises a hollow generally cylindrical thermally conductive body 1001 fabricated from, for example, die cast aluminum. The body 1001 functions as a heat sink and dissipates heat generated by the light emitters 1007. To increase heat radiation from the downlight 1000 and thereby increase cooling of the downlight 1000, the body 1001 can include a series of latitudinal spirally extending heat radiating fins 1003 located towards the base of the body 1001. To further increase the radiation of heat, the outer surface of the body can be treated to increase its emissivity such as for example painted black or anodized. The body 1001 further comprises a generally frustoconical (e.g. a cone whose apex is truncated by a plane that is parallel to the base) axial chamber 1005 that extends from the front of the body a depth of approximately two thirds of the length of the body. The form factor of the body 1001 is configured to enable the downlight to be retrofitted directly in a standard six inch downlighting fixture (can) as are commonly used in the United States.

Four solid state light emitters 1007 are mounted as a square array on a circular shaped MCPCB (Metal Core Printed Circuit Board) 1009. As is known an MCPCB comprises a layered structure composed of a metal core base, typically aluminum, a thermally conducting/electrically insulating dielectric layer and a copper circuit layer for electrically connecting electrical components in a desired circuit configuration. With the aid of a thermally conducting compound such as for example a standard heat sink compound containing beryllium oxide or aluminum nitride the metal core base of the MCPCB 1009 is mounted in thermal communication with the body via the floor of the chamber 1005. As shown in FIG. 5 the MCPCB 1009 can be mechanically fixed to the body floor by one or more screws, bolts or other mechanical fasteners.

The downlight 1000 further comprises a hollow generally cylindrical light reflective chamber wall mask 1015 that surrounds the array of light emitters 1007. The chamber wall mask 1015 can be made of a plastics material and preferably has a white or other light reflective finish. A wavelength conversion component 200, such as the one described above in FIG. 2, may be mounted overlying the front of the chamber wall mask 1015 using, for example, an annular steel clip that has resiliently deformable barbs that engage in corresponding apertures in the body. The wavelength conversion component 200 may be remote to the light emitters 1007.

The wavelength conversion component 200 comprises a first light transmissive hermetic substrate 201, a wavelength conversion layer 203, and a second light transmissive hermetic substrate 203 as described above. The light transmissive hermetic substrates 201, 205 protect the surfaces of the wavelength conversion layer 203 from exposure to environmental contaminants, as discussed above. Additionally, having a light transmissive hermetic substrate 201, 205 on each surface of the wavelength conversion layer 203 protects against handling damage, such as surface scratches, which also degrade the performance and lifetime of the wavelength conversion layer over time, also discussed above.

The downlight 1000 further comprises a light reflective hood 1025 which is configured to define the selected emission angle (beam spread) of the downlight (e.g. 60° in this example). The hood 1025 comprises a generally cylindrical shell with three contiguous (conjoint) inner light reflective frustoconical surfaces. The hood 1025 is preferably made of Acrylonitrile butadiene styrene (ABS) with a metallization layer. Finally the downlight 1000 can comprise an annular trim (bezel) 1027 that can also be fabricated from ABS.

Figure 11A:
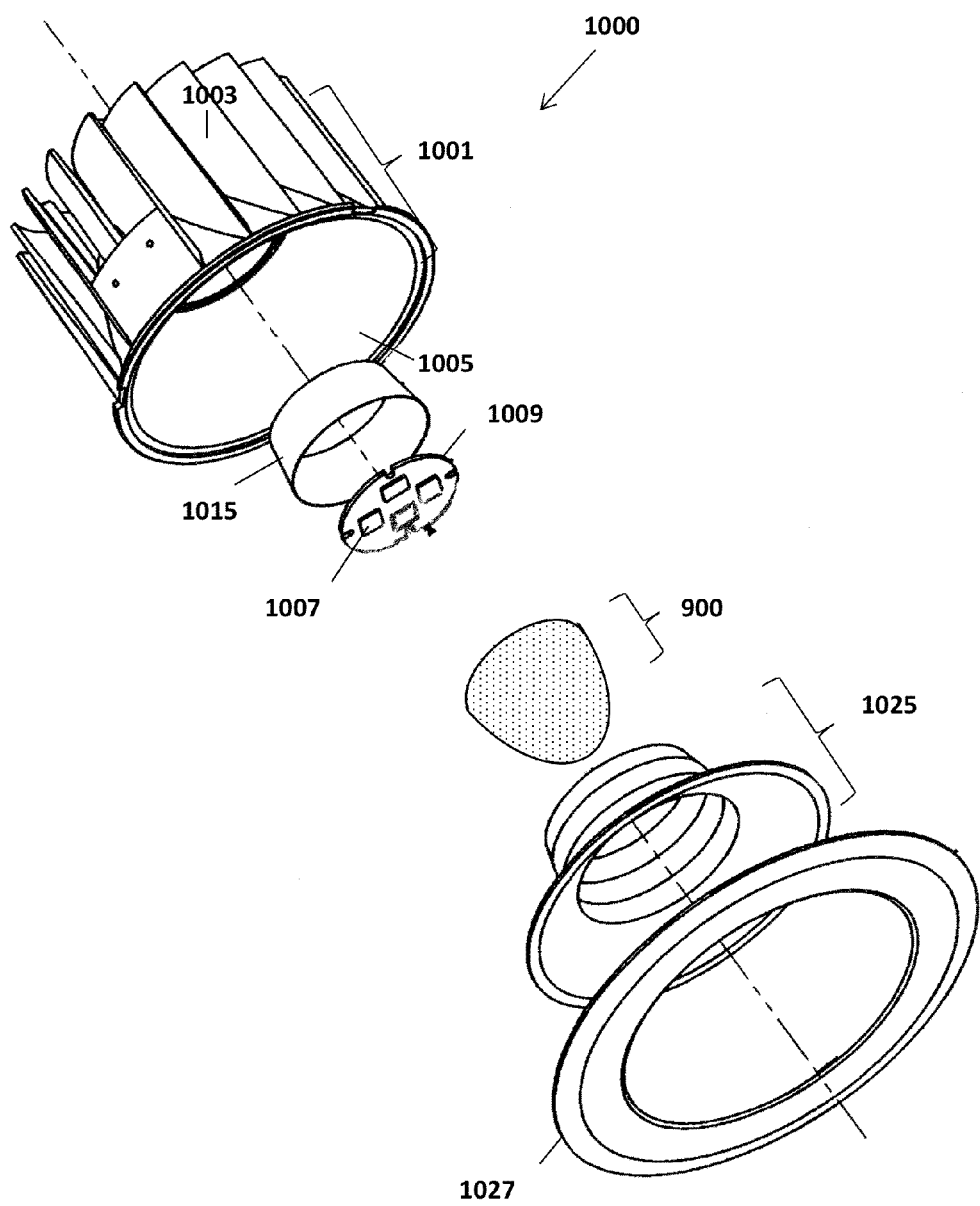
FIGS. 11A, 11B, and 11C illustrate another example of an application of a wavelength conversion component in accordance with some embodiments.
Figure 11B:
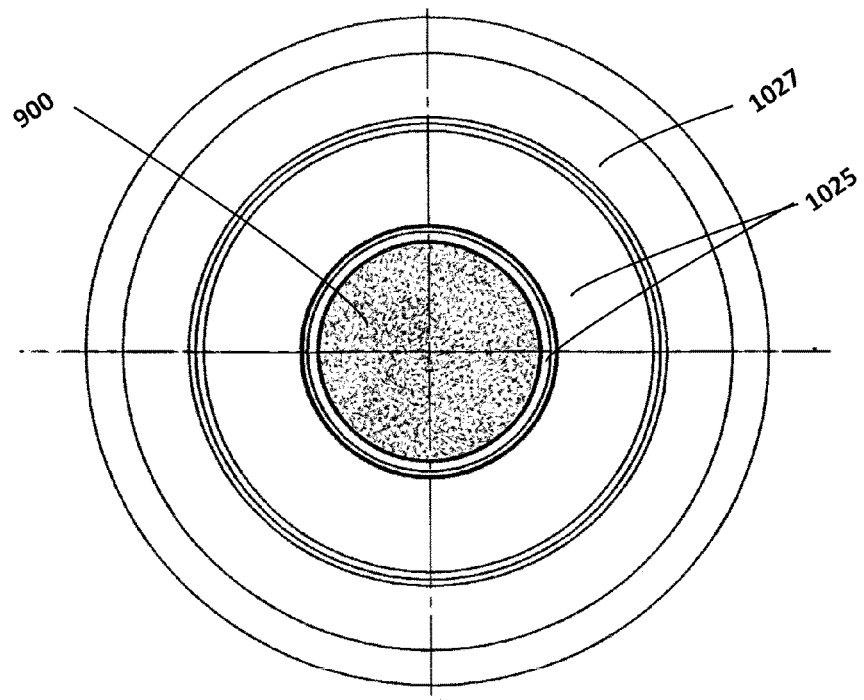
Figure 11C:
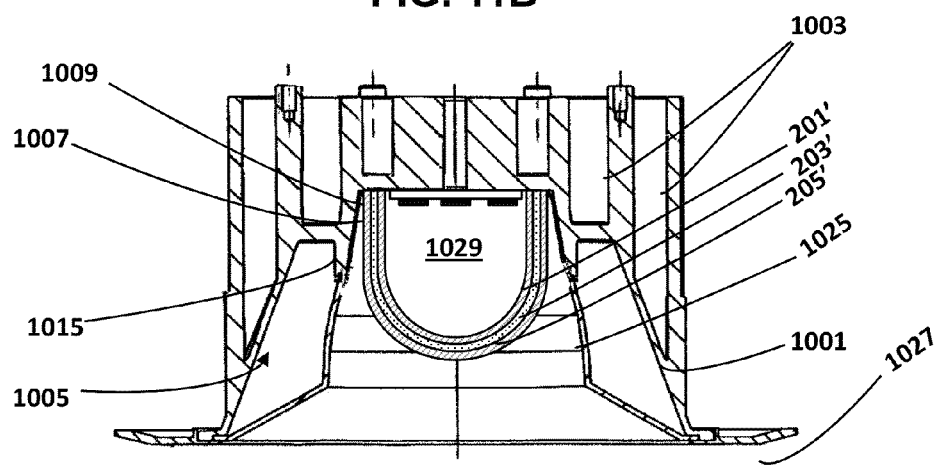

FIGS. 11A, 11B, and 11C illustrate another example of an application of a wavelength conversion component in accordance with some embodiments. FIGS. 11A, 11B, and 11C illustrate an LED downlight 1100 in accordance with some embodiments. FIG. 11A is an exploded perspective view of the LED downlight 1100, FIG. 11B is an end view of the downlight 1100, and FIG. 11C is a sectional view of the downlight 1100. The downlight 1100 is configured to generate light with an emission intensity of 650-700 lumens and a nominal beam spread of 60° (wide flood). It is intended to be used as an energy efficient replacement for a conventional incandescent six inch downlight.

The downlight 1100 of FIGS. 11A, 11B, and 11C is substantially the same as the downlight 1000 of FIGS. 10A, 10B, and 10C. For purposes of discussion, only features of the downlight 1100 that are new relative to the embodiments of FIGS. 10A, 10B, and 10C will be described.

Whereas the wavelength conversion component 200 of FIGS. 10A, 10B, and 10C has a two-dimensional shape (e.g., is substantially planar), the wavelength conversion component 900 of FIGS. 11A, 11B, and 11C has a three-dimensional shape (e.g., elongated dome shaped and/or ellipsoidal shell). The three dimensional wavelength conversion component 900 includes a three-dimensional first light transmissive hermetic substrate 201', a three-dimensional wavelength conversion layer 203', and a three-dimensional second light transmissive hermetic substrate 205', such as the wavelength conversion component 900 described above in FIG. 9A. The wavelength conversion component may also be mounted enclosing the front of the chamber wall mask 1015.

As discussed above, the light transmissive hermetic substrates 201', 205' protect the surfaces of the wavelength conversion layer 203' from exposure to environmental contaminants, as discussed above. Additionally, having a light transmissive hermetic substrate 201', 205' on each surface of the wavelength conversion layer 203' protects against handling damage, such as surface scratches, which also degrade the performance and lifetime of the wavelength conversion layer over time.

Figure 12:
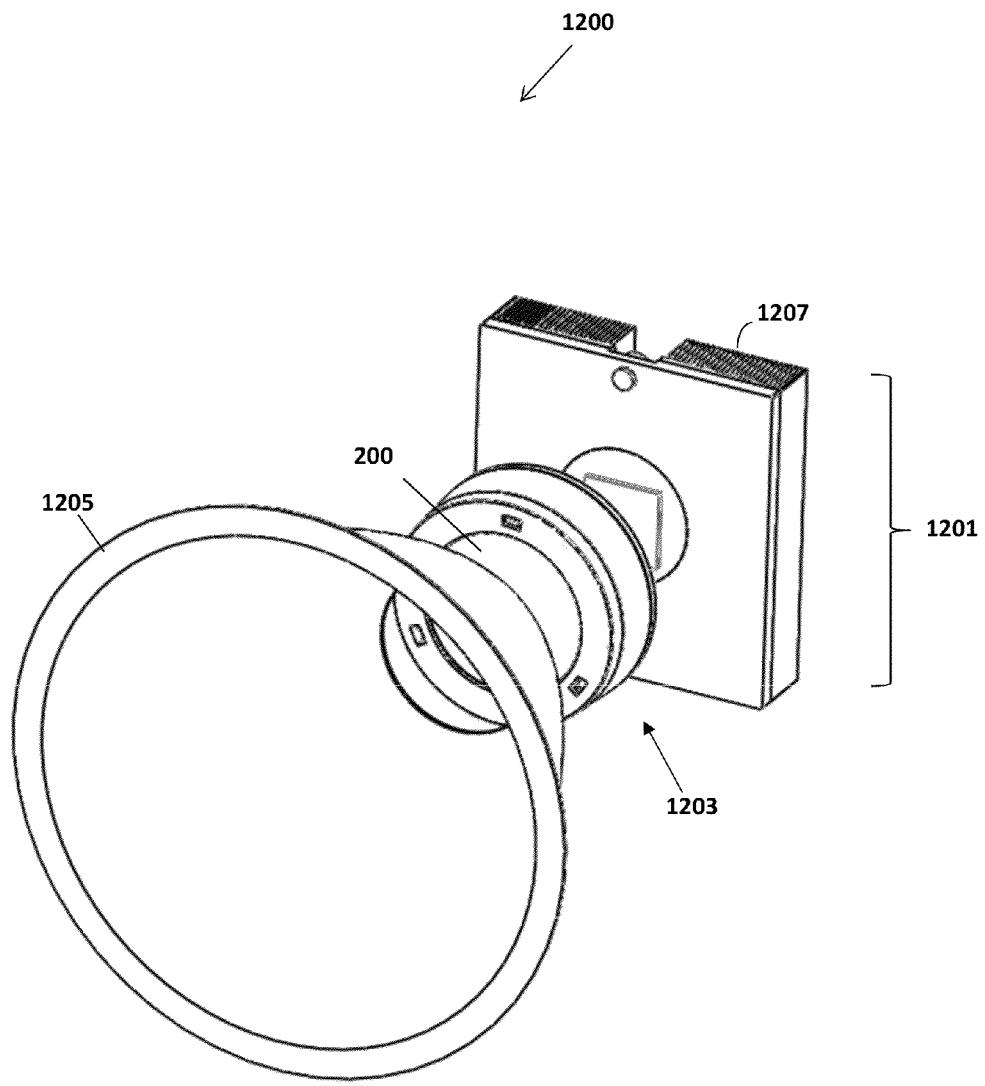
FIG. 12 illustrates another example of an application of a wavelength conversion component in accordance with some embodiments.

FIG. 12 illustrates another example of an application of a wavelength conversion component in accordance with some embodiments. FIG. 12 illustrates an exploded perspective view of a reflector lamp 1200 in accordance with some embodiments. The reflector lamp 1200 is configured to generate light with an emission intensity of 650-700 lumens and a nominal beam spread of 60° (wide flood). It is intended to be used as an energy efficient replacement for a conventional incandescent six inch downlight.

The reflector lamp 1200 comprises a generally rectangular thermally conductive body 1201 fabricated from, for example, die cast aluminum. The body 1201 functions as a heat sink and dissipates heat generated by the light emitting device 1203. To increase heat radiation from the reflector lamp 1200 and thereby increase cooling of the light emitting device 1203, the body 1201 can include a series of heat radiating fins 1207 located on the sides of the body 1201. To further increase the radiation of heat, the outer surface of the body 1201 can be treated to increase its emissivity such as for example painted black or anodized. The body 1201 further comprises a thermally conductive pad that may be placed in contact with a thermally conductive base of the light emitting device 1203. The form factor of the body 1201 is configured to enable the downlight to be retrofitted directly in a standard six inch downlighting fixture (a "can") as are commonly used in the United States.

A light emitting device 1203 that includes a wavelength conversion component 200 such as the one described above with respect to FIG. 2 may be attached to the body 1201 such that the thermally conductive base of the light emitting device 1203 may be in thermal contact with the thermally conductive pad of the body 1201. The light emitting device 1203 may include a hollow cylindrical body with a base and sidewalls that is substantially the same as the cylindrical body described in FIG. 1 that is configured to house the wavelength conversion component 200.

While not illustrated, the wavelength conversion component 200 may include a first light transmissive hermetic substrate, a wavelength conversion layer, and a second light transmissive hermetic substrate, as described above with respect to FIG. 2. As discussed above, the light transmissive hermetic substrates protect the surfaces of the wavelength conversion layer from exposure to environmental contaminants, as discussed above. Additionally, having a light transmissive hermetic substrate on each surface of the wavelength conversion layer protects against handling damage, such as surface scratches, which also degrade the performance and lifetime of the wavelength conversion layer over time.

The reflector lamp 1200 further comprises a generally frustroconical light reflector 1205 having a paraboloidal light reflective inner surface which is configured to define the selected emission angle (beam spread) of the downlight (e.g. 60° in this example). The reflector 1205 is preferably made of Acrylonitrile butadiene styrene (ABS) with a metallization layer.

Figure 13A:
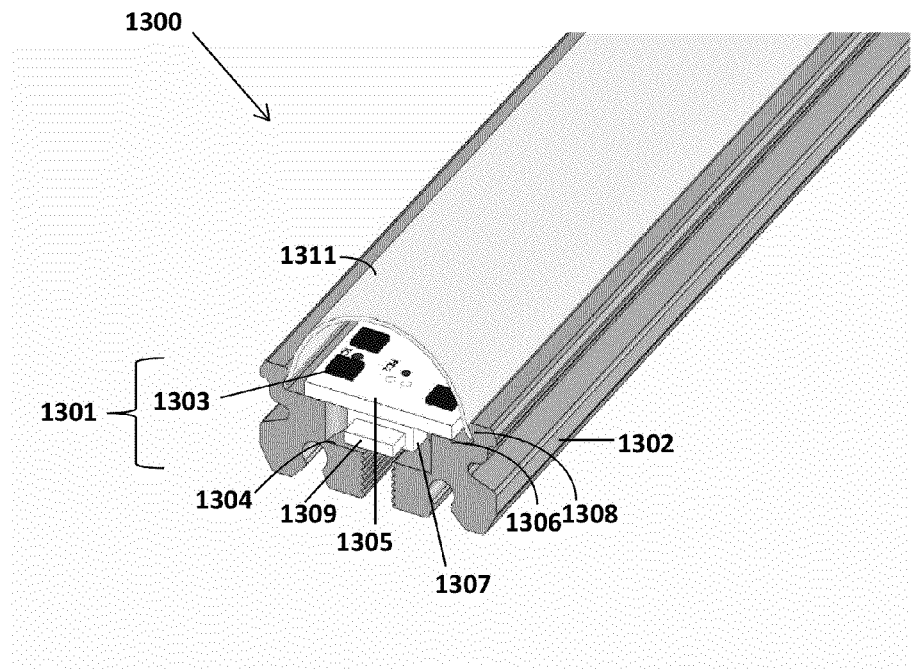
FIGS. 13A and 13B illustrate another example of an application of a wavelength conversion component in accordance with some embodiments.
Figure 13B:
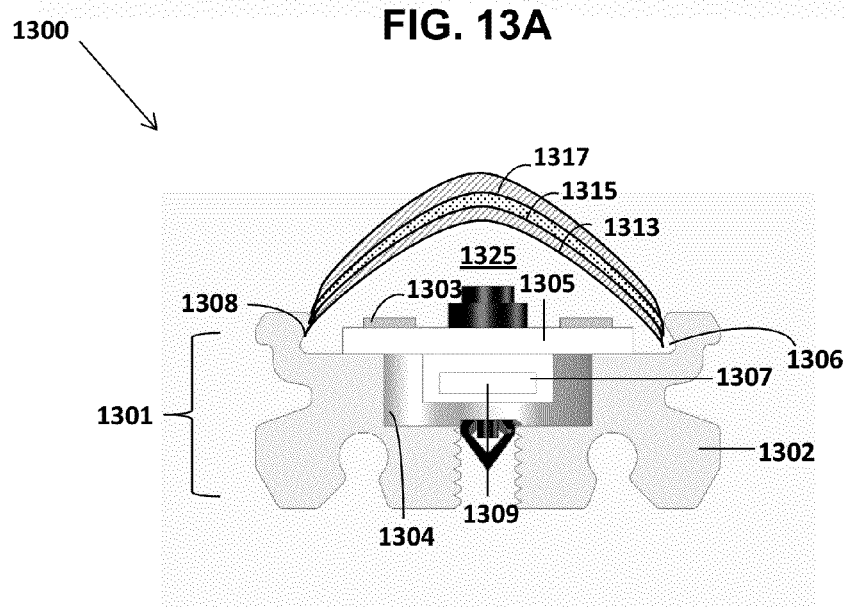

FIGS. 13A and 13B illustrate another example of an application of a wavelength conversion component in accordance with some embodiments. FIGS. 13A and 13B illustrate an LED linear lamp 1300 in accordance with some embodiments. FIG. 13A is a three-dimensional perspective view of the linear lamp 1300 and FIG. 13B is a cross-sectional view of the linear lamp 1300. The LED linear lamp 1300 is intended to be used as an energy efficient replacement for a conventional incandescent or fluourescent tube lamp.

The linear lamp 1300 comprises an elongated thermally conductive body 1301 fabricated from, for example, die cast aluminum. The form factor of the body 1301 is configured to be mounted with a standard linear lamp housing. The body 1301 further comprises a first recessed channel 1304, wherein a rectangular tube-like case 1307 containing some electrical components (e.g., electrical wires) of the linear lamp 1300 may be situated. The case 1307 may further comprise an electrical connector 1309 (e.g., plug) extending past the length of the body 1301 on one end, and a recessed complimentary socket (not shown) configured to receive a connector on another end. This allows several linear lamps 1300 to be connected in series to cover a desired area. Individual linear lamps 1300 may range from 1 foot to 6 feet in length.

The body 1301 functions as a heat sink and dissipates heat generated by the light emitters 1303. To increase heat radiation from the linear lamp 1300 and thereby increase cooling of the light emitters 1303, the body 1301 can include a series of heat radiating fins 1302 located on the sides of the body 1301. To further increase heat radiation from the linear lamp 1300, the outer surface of the body 1301 can be treated to increase its emissivity such as for example painted black or anodized.

Light emitters 1303 are mounted on a strip (rectangular shaped) MCPCB 1305 configured to sit above the first recessed channel 1304. The under surface of the MCPCB 1305 sits in thermal contact with a second recessed channel 1306 that includes inclined walls 1308.

A generally hemi-spherical elongate wavelength conversion component 1311 may be positioned remote to the light emitters 1303. The wavelength conversion component 1311 may be secured within the second recessed channel 1306 by sliding the wavelength conversion component 1311 under the inclined walls 1308 such that the wavelength conversion component 1311 engages with inclined walls 1308. The wavelength conversion component 1311 may also be flexibly placed under the inclined walls 1308 such that the wavelength conversion component 1311 engages with the inclined walls 1308.

The wavelength conversion component 1311 may include a hemi-spherical elongate first light transmissive hermetic substrate 1313, a hemi-spherical elongate wavelength conversion layer 1315, and a hemi-spherical elongate second light transmissive hermetic substrate 1317. The light transmissive hermetic substrates 1313, 1317 protect the surfaces of the wavelength conversion layer 1315 from exposure to environmental contaminants, as discussed above. Additionally, having a light transmissive hermetic substrate 1313, 1317 on each surface of the wavelength conversion layer 1315 protects against handling damage, such as surface scratches, which also degrade the performance and lifetime of the wavelength conversion layer 1315 over time.

In alternative embodiments, the wavelength conversion component of the linear lamp may be configured in the shape of a generally planar strip. In such embodiments, it will be appreciated that the second recessed channel may instead have vertical walls that extend to allow the wavelength conversion component to be received by the second recessed channel.

Figure 14A:
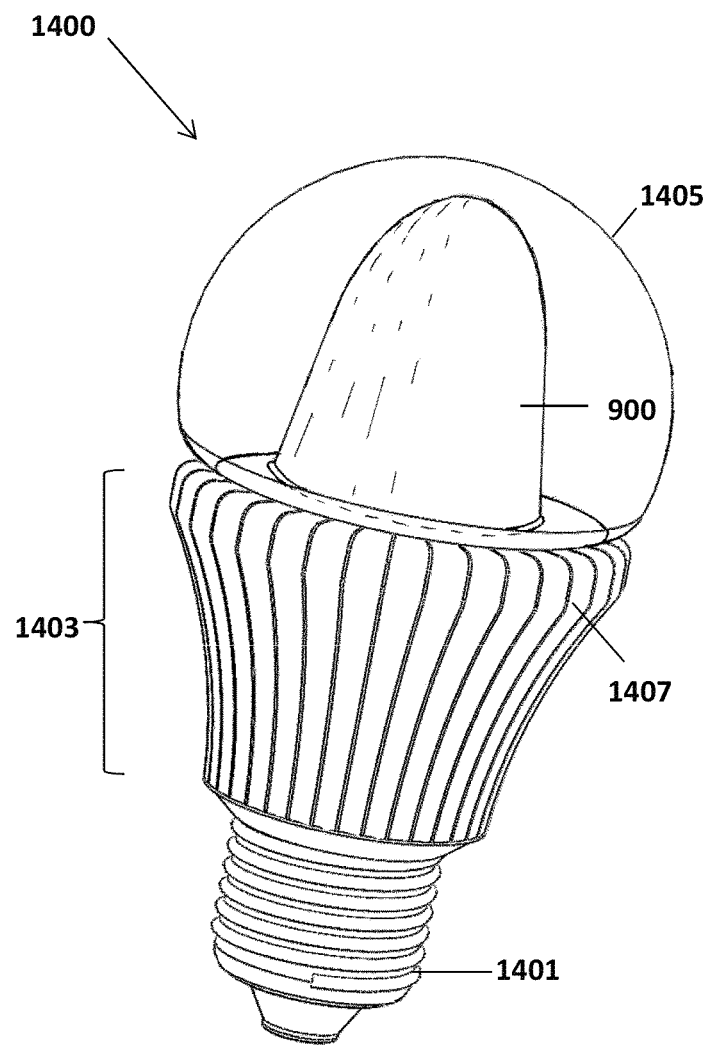
FIGS. 14A and 14B illustrate a perspective view and a cross-sectional view of an application of a wavelength conversion component in accordance with some embodiments.
Figure 14B:
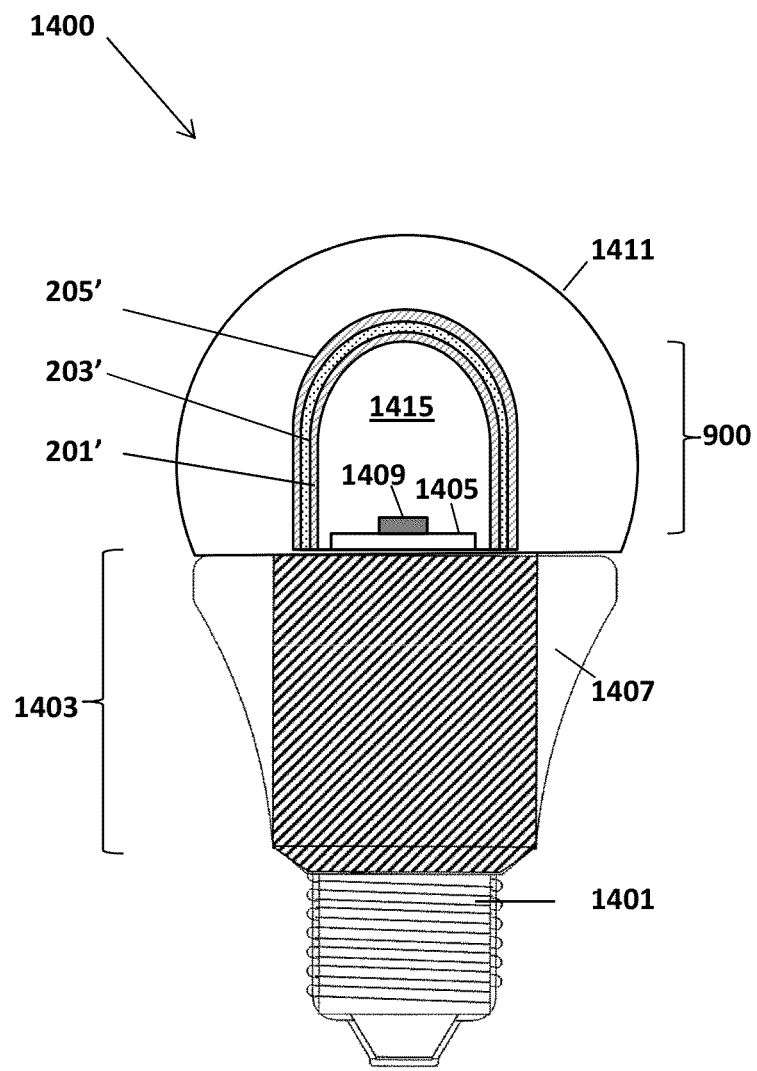

FIGS. 14A and 14B illustrate a perspective view and a cross-sectional view of an application of a wavelength conversion component in accordance with some embodiments. FIGS. 14A and 14B illustrate an LED light bulb 1400 that utilizes remote wavelength conversion. The LED light bulb 1400 is intended to be used as an energy efficient replacement for a conventional incandescent or fluorescent light bulb.

The light bulb 1400 comprises a screw base 1401 that is configured to fit within standard light bulb sockets, e.g. implemented as a standard Edison screw base. The light bulb 1400 may further comprise a thermally conductive body 1403 fabricated from, for example, die cast aluminum. The body 1403 functions as a heat sink and dissipates heat generated by the light emitters 1409, which are mounted on a MCPCB 1405. The MCPCB 1405 may be in thermal contact with the body 1403. To increase heat radiation from the light bulb 1400 and thereby increase cooling of the light bulb 1400, the body 1403 can include a series of latitudinal radially extending heat radiating fins 1407. To further increase the radiation of heat, the outer surface of the body 1403 can be treated to increase its emissivity such as for example painted black or anodized.

The light bulb 1400 comprises a wavelength conversion component 900, such as the one described above in FIG. 9, having a three-dimensional shape (e.g., elongated dome shaped and/or ellipsoidal shell) that encloses the light emitters 1409. The three dimensional wavelength conversion component 900 includes a three-dimensional first light transmissive hermetic substrate 201', a three-dimensional wavelength conversion layer 203', and a three-dimensional second light transmissive hermetic substrate 205'. The light transmissive hermetic substrates 201', 205' protect the surfaces of the wavelength conversion layer 203' from exposure to environmental contaminants, as discussed above. Additionally, having a light transmissive hermetic substrate 201', 205' on each surface of the wavelength conversion layer 203' protects against handling damage, such as surface scratches, which also degrade the performance and lifetime of the wavelength conversion layer 203' over time.

An envelope 1411 may extend around the upper portion of the LED light bulb 1400, enclosing the light emitters 1409 and the wavelength conversion component 900. The envelope 1411 is a light-transmissive material (e.g. glass or plastic) that provides protective and/or diffusive properties for the LED light bulb 1400.

Figure 15:
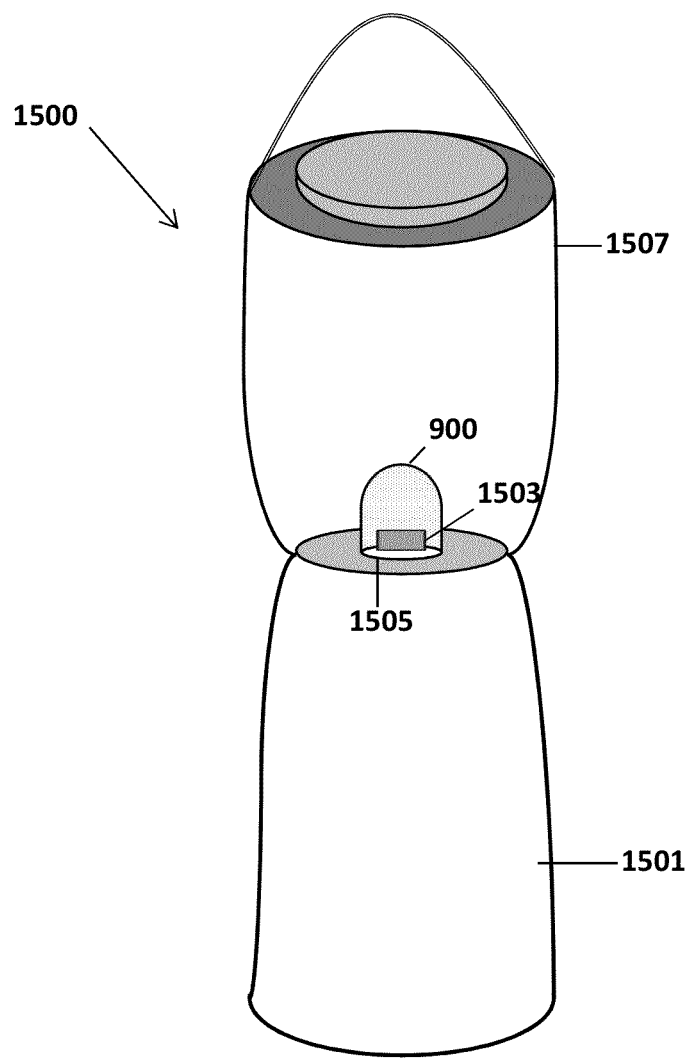
FIG. 15 illustrates a perspective of another application of a wavelength conversion component in accordance with some embodiments.

FIG. 15 illustrates a perspective view of another application of a wavelength conversion component in accordance with some embodiments. FIG. 15 illustrates an LED lantern 1500 that utilizes remote wavelength conversion. The LED light lantern 1500 is intended to be used as an energy efficient replacement for conventional gas and fluorescent lanterns (e.g., camping lanterns).

The lantern 1500 comprises a generally cylindrical thermally conductive body 1501 fabricated from, for example, plastic material or pressed metal. The body 1501 further includes an internal heat sink which dissipates heat generated by the light emitters 1503, which are mounted on a circular shaped MCPCB 1505. The MCPCB 1505 may be in thermal contact with the body 1501.

The lantern 1500 comprises a three-dimensional (e.g., elongated dome shaped and/or ellipsoidal shell) wavelength conversion component 900, such as the one described above in FIG. 9, that extends from the MCPCB 1505. While only an exterior surface of the wavelength conversion component 900 is depicted, it is important to note that the three dimensional wavelength conversion component 900 may include a three-dimensional first light transmissive hermetic substrate, a three-dimensional wavelength conversion layer, and a three-dimensional second light transmissive hermetic substrate, as described in FIG. 9.

As discussed above, the light transmissive hermetic substrates protect the surfaces of the wavelength conversion layer from exposure to environmental contaminants. Additionally, having a light transmissive hermetic substrate on each surface of the wavelength conversion layer protects against handling damage, such as surface scratches, which also degrade the performance and lifetime of the wavelength conversion layer over time.

A light transmissive cover 1507 may extend around the upper portion of the lantern, surrounding the light emitters 1503 and the wavelength conversion component 900. The light transmissive cover 1507 comprises a light-transmissive material (e.g. glass or plastic) that provides protective and/or diffusive properties for the LED lantern 1500. The lantern 1500 may further comprise a lid that sits on top of the light transmissive cover 1507 to enclose the light emitters 1503 and the wavelength conversion component 900.

The above applications of light emitting devices describe a remote wavelength conversion configuration, wherein a wavelength conversion component is remote to one or more light emitters. The wavelength conversion component and body of those light emitting devices define an interior volume wherein the light emitters are located. The interior volume may also be referred to as a light mixing chamber. For example, in the downlight 1000, 1100 of FIG. 8A, 8B, 8C, 9A, 9B, and 9C, an interior volume 1029 is defined by the wavelength conversion component 200, 900, the light reflective chamber mask 1015, and the body of the downlight 1001. In the linear lamp 1300 of FIGS. 11A and 11B, an interior volume 1325 is defined by the wavelength conversion component 1311 and the body of the linear lamp 1301. In the light bulb 1400 of FIGS. 12A and 12B, an interior volume 1415 is defined by the wavelength conversion component 900 and the body of the light bulb 1407. Such an interior volume provides a physical separation (air gap) of the wavelength conversion component from the light emitters that improves the thermal characteristics of the light emitting device. Due to the isotropic nature of photoluminescence light generation, approximately half of the light generated by the phosphor material can be emitted in a direction towards the light emitters and can end up in the light mixing chamber. It is believed that on average as little as 1 in a 10,000 interactions of a photon with a phosphor material particle results in absorption and generation of photoluminescence light. The majority, about 99.99%, of interactions of photons with a phosphor particle result in scattering of the photon. Due to the isotropic nature of the scattering process on average half the scattered photons will be in a direction back towards the light emitters. As a result up to half of the light generated by the light emitters that is not absorbed by the phosphor material can also end up back in the light mixing chamber. To maximize light emission from the device and to improve the overall efficiency of the light emitting device the interior volume of the mixing chamber includes light reflective surfaces to redirect—light in—the interior volume towards the wavelength conversion component and out of the device. The light mixing chamber may also operate to mix light within the chamber. The light mixing chamber can be defined by the wavelength conversion component in conjunction with another component of the device such a device body or housing (e.g., dome-shaped wavelength conversion component encloses light emitters located on a base of device body to define light mixing chamber, or planar wavelength conversion component placed on a chamber shaped component to enclose light emitters located on a base of device body and surrounded by the chamber shaped component to define light mixing chamber). For example, the downlight 1000, 1100 of FIGS. 8A, 8B, 8C, 9A, 9B, and 9C, includes an MCPCB 1009, on which the light emitters 1007 are mounted, comprising light reflective material and a light reflective chamber wall mask 1015 to facilitate the redirection of light reflected back into the interior volume towards the wavelength conversion component 200, 900. The linear lamp 1300 of FIGS. 11A and 11B includes an MCPCB 1305, on which the light emitters 1303 are mounted, comprising light reflective material to facilitate the redirection of light reflected back into the interior volume towards the wavelength conversion component 1311. The light bulb 1400 of FIGS. 12A and 12B also includes an MCPCB 1405, on which the light emitters 1409 are mounted, to facilitate the redirection of light reflected back into the interior volume towards the wavelength conversion component 900.

The above applications of light emitting devices describe only a few embodiments with which the claimed invention may be applied. It is important to note that the claimed invention may be applied to other types of light emitting device applications, including but not limited to, wall lamps, pendant lamps, chandeliers, recessed lights, track lights, accent lights, stage lighting, movie lighting, street lights, flood lights, beacon lights, security lights, traffic lights, headlamps, taillights, signs, etc.

Therefore, what has been described is a wavelength conversion component with improved protective characteristics for remote wavelength conversion. The improved wavelength conversion component comprises a wavelength conversion layer between a first light transmissive hermetic substrate and a second light transmissive hermetic substrate. By placing the wavelength conversion layer between the first light transmissive hermetic substrate and the second light transmissive hermetic substrate, the surfaces of the wavelength conversion layer may be protected from exposure to environmental contaminants and also protected against handling damage, which degrade the performance and lifetime of the wavelength conversion layer over time.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A linear lamp comprising:
    an elongate housing;
    a plurality of solid-state light emitters housed within the housing and configured along the length of the housing; and
    an elongate wavelength conversion component remote to the plurality of solid-state light emitters and configured to in part at least define a light mixing chamber,
    wherein the elongate wavelength conversion component comprises:
        an elongate first light transmissive hermetic substrate;
        an elongate second light transmissive hermetic substrate; and
        an elongate wavelength conversion layer located between the elongate first light transmissive hermetic substrate and the elongate second light transmissive hermetic substrate, such that the elongate first light transmissive hermetic substrate and the elongate second light transmissive hermetic substrate form a barrier to a first surface and a second surface of the elongate wavelength conversion layer, wherein the elongate wavelength conversion layer comprises a mixture of a light transmissive carrier material and a photoluminescent material, the light transmissive carrier material being a different material from the first and second light transmissive hermetic substrates, and having substantially the same index of refraction as the first and second light transmissive hermetic substrates, and
    wherein the elongate wavelength conversion component has a configuration forming a shell with an inner surface that defines an interior volume.

2. The linear lamp in claim 1, wherein the first light transmissive hermetic substrate and the second light transmissive hermetic substrate are configured to filter UV light.

3. The linear lamp in claim 1, wherein the wavelength conversion layer includes a layer of a light transmissive carrier material.

4. The linear lamp of claim 1, wherein the elongate first light transmissive hermetic substrate and the elongate second light transmissive hermetic substrate are in direct contact with the first surface and the second surface of the elongate wavelength conversion layer.

5. The linear lamp of claim 1, wherein the elongate first light transmissive hermetic substrate and the elongate second light transmissive hermetic substrate are composed of the same material.

6. The linear lamp of claim 5, wherein the material is selected from the group consisting of glass and sapphire.

7. The linear lamp of claim 1, wherein the elongate first light transmissive hermetic substrate is composed of glass and the elongate second light transmissive hermetic substrate is composed of sapphire.

8. The linear lamp of claim 1, wherein the elongate first light transmissive hermetic substrate and the elongate second light transmissive hermetic substrate have substantially the same coefficient of thermal expansion.

9. The linear lamp of claim 1, wherein
    the elongate wavelength conversion layer is formed as a deposition on the elongate first light transmissive hermetic substrate; and
    the elongate first light transmissive hermetic substrate, the elongate wavelength conversion layer, and the elongate second light transmissive hermetic substrate are cured components.

10. The linear lamp of claim 1, wherein
    the elongate wavelength conversion layer is cured prior to placing the elongate second light transmissive hermetic substrate on the elongate wavelength conversion layer.

11. The linear lamp of claim 1, wherein the elongate wavelength conversion layer corresponds to a deposit of material using a method selected from the group consisting of: screen printing, slot die coating, spin coating, roller coating, drawdown coating and doctor blading.

12. The linear lamp of claim 9, wherein the elongate wavelength conversion layer between the elongate first light transmissive hermetic substrate and the elongate second light transmissive hermetic substrate was laminated before curing.

13. The linear lamp of claim 12, wherein the elongate wavelength conversion layer was laminated based on hot laminating or cold laminating.

* * * * *